(12) United States Patent
Segovia Fernandez et al.

(10) Patent No.: US 10,727,815 B2
(45) Date of Patent: Jul. 28, 2020

(54) METHODS AND APPARATUS TO MEASURE RESONANT SENSORS BASED ON DETECTION OF GROUP DELAY

(71) Applicant: Texas Instruments Incorporated, Dallas, TX (US)

(72) Inventors: Jeronimo Segovia Fernandez, San Jose, CA (US); Peter Smeys, San Jose, CA (US); Ali Djabbari, Saratoga, CA (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 16/446,007

(22) Filed: Jun. 19, 2019

(65) Prior Publication Data

US 2020/0186130 A1 Jun. 11, 2020

Related U.S. Application Data

(60) Provisional application No. 62/776,248, filed on Dec. 6, 2018.

(51) Int. Cl.
*H03J 7/04* (2006.01)
*H03B 5/06* (2006.01)

(52) U.S. Cl.
CPC ............. *H03J 7/04* (2013.01); *H03B 5/06* (2013.01); *B81B 2201/0271* (2013.01)

(58) Field of Classification Search
CPC .................................... H03J 7/04; H03B 5/06
See application file for complete search history.

(56) References Cited

U.S. PATENT DOCUMENTS

2007/0247138 A1* 10/2007 Miller ................. A61B 5/0031
324/76.51
2014/0275861 A1* 9/2014 Kroh ..................... A61B 5/002
600/302

* cited by examiner

*Primary Examiner* — Nguyen T Vo
(74) *Attorney, Agent, or Firm* — John R. Pessetto; Charles A. Brill; Frank D. Cimino

(57) ABSTRACT

Methods, apparatus, systems and articles of manufacture are disclosed to measure a resonant sensor based on detection of group delay. An example apparatus includes a modulation manager configured to query the resonant sensor with a modulated signal including a frequency; and a resonance determiner configured to determine a resonance frequency of the resonant sensor based on a group delay associated with the resonant sensor and the frequency.

18 Claims, 10 Drawing Sheets

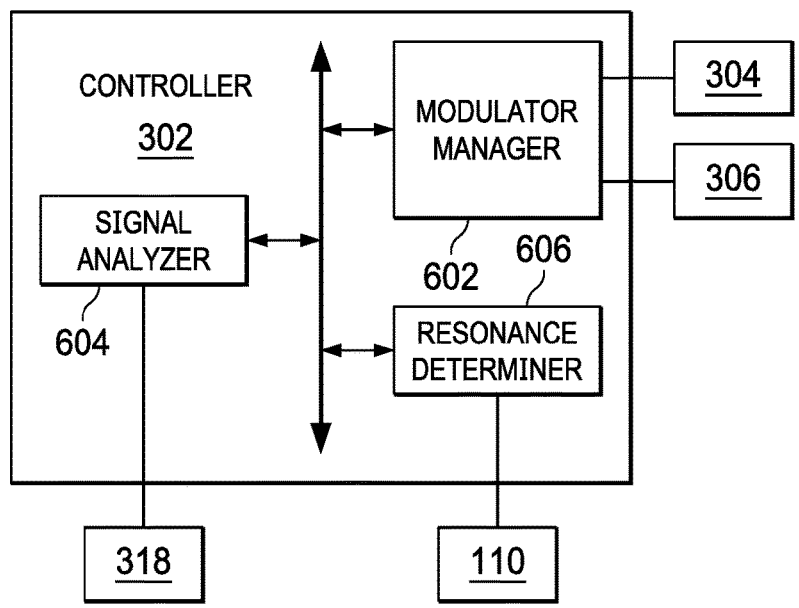
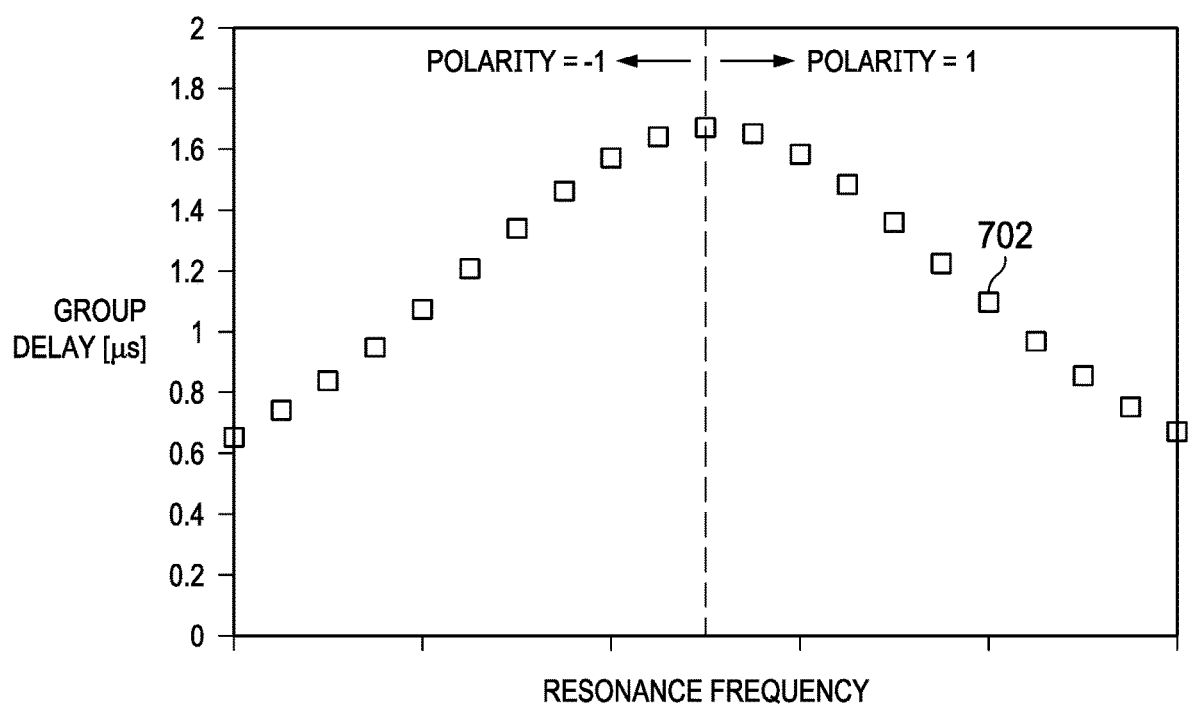

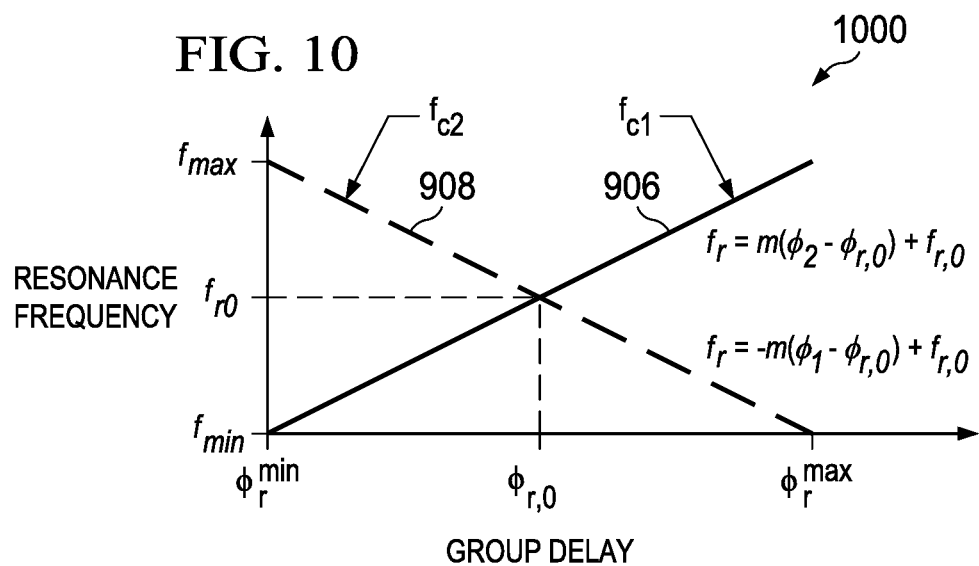
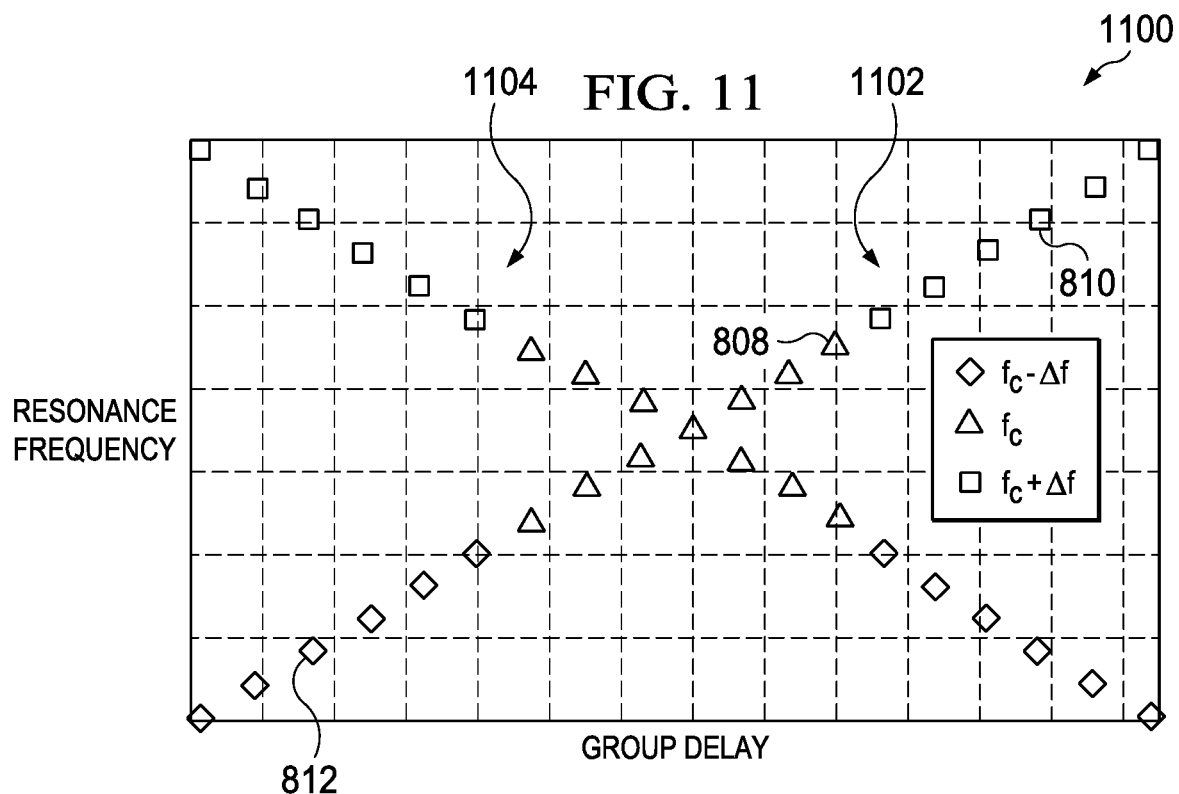

METHODS AND APPARATUS TO MEASURE RESONANT SENSORS BASED ON DETECTION OF GROUP DELAY

RELATED APPLICATION

This patent claims the benefit of U.S. Provisional Application Ser. No. 62/776,248, which was filed on Dec. 6, 2018. U.S. Provisional Application Ser. No. 62/776,248 is hereby incorporated herein by reference in its entirety. Priority to U.S. Provisional Application Ser. No. 62/776,248 is hereby claimed.

FIELD OF THE DISCLOSURE

This disclosure relates generally to sensor measurement, and, more particularly, to methods and apparatus to measure resonant sensors based on detection of group delay.

BACKGROUND

Resonant sensors, or more generally resonators, are devices or systems that resonate at specific frequencies or exhibit resonant behavior. Moreover, when these resonant sensors are subjected to an input power, they oscillate. The amplitude of oscillation depends on the frequency of oscillation. For example, a resonant sensor will oscillate with greater amplitude when the frequency of oscillation coincides with any of its resonant frequencies. Depending on design choices or other factors, a resonant sensor may be electrically based and/or mechanically based (e.g., acoustic). Resonant sensors may be used to monitor a variety of physical quantities including temperature, humidity, pressure, and torque. For example, the temperature of an environment can affect the resonance frequency of a resonant sensor. In such an example, as the temperature of the environment changes, the mechanical properties of the materials included in the resonant sensor will change based on the temperature. This change in material properties corresponds to a change in resonance frequency, thus by determining the resonance frequency the temperature can be determined.

Resonant sensors may be implemented as microelectromechanical systems (MEMS) and nanoelectromechanical systems (NEMS). In some cases, MEMS are referred to as micromachines and/or micro systems technology (MST) whereas NEMS are referred to as nanomachines and/or nano-systems technology. To monitor the response of such MEMS or NEMS, a sensor monitor is utilized. In some applications, the sensor monitor is a separate device or system that monitors the resonant sensor. The sensor monitor can measure a shift in resonance frequency of the resonant sensors. When a sensor monitor detects a shift in resonance frequency, the shift can be interpreted as a shift in the underlying physical quantity being measured (e.g., temperature, pressure, torque, etc.).

BRIEF DESCRIPTION OF THE DRAWINGS

FIG. 6 is a block diagram illustrating an example of the controller of FIG. 3 and FIG. 4.

FIG. 7 is a graphical illustration of a non-linear distribution of the group delay of the first resonant sensor of FIGS. 1, 3, and 4 when the first resonant sensor is queried at a fixed carrier frequency.

FIG. 10 is a graphical illustration showing an intersection of the first linear region and the second linear region of FIG. 9 intersecting at a resonance frequency.

FIG. 11 is a graphical illustration of a first extended linear region and a second extended linear region.

The figures are not to scale. In general, the same reference numbers will be used throughout the drawing(s) and accompanying written description to refer to the same or like parts.

Figure 1:
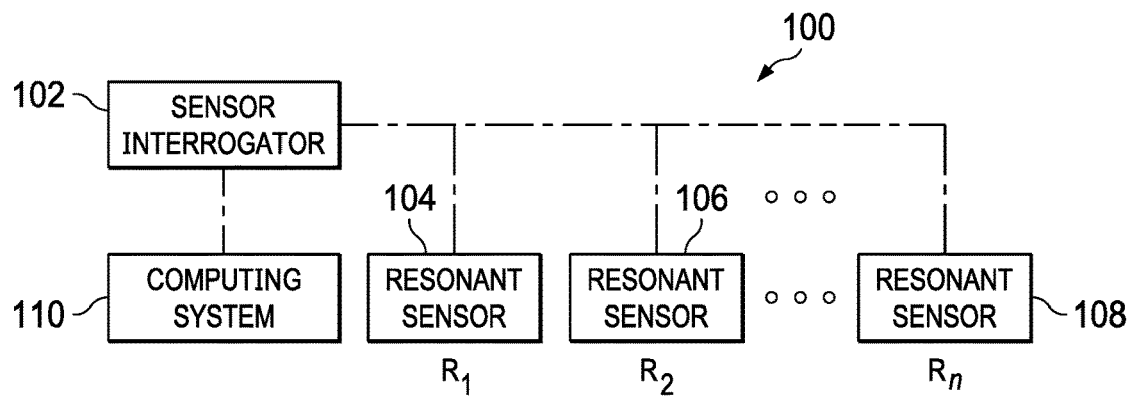
FIG. 1 is a schematic illustration of an example resonant sensor system.

Descriptors "first," "second," "third," etc. are used herein when identifying multiple elements or components which may be referred to separately. Unless otherwise specified or understood based on their context of use, such descriptors are not intended to impute any meaning of priority or ordering in time but merely as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

DETAILED DESCRIPTION

Resonant sensors often exhibit high operating frequencies and low mechanical damping. For example, an acoustic resonant sensor operates in the range of megahertz (MHz) to gigahertz (GHz) and includes low mechanical damping, which corresponds to high quality factors (Q). These operational characteristics of resonant sensors are desirable because they make resonant sensors highly sensitive when measuring physical quantities. In order to determine the magnitude of the physical quantity under measurement, a resonant sensor of MEMS or NEMS is exposed to the physical quantity. Based on the magnitude of the physical quantity the resonant sensor is exposed to, the resonant sensor exhibits a particular shift of any of its resonance frequencies. In MEMS or NEMS, the resonant sensor may be coupled to an oscillator circuit that continuously consumes power and is coupled to the resonant sensor via wires, flip-chip interconnections, or near-field inductive couplers. For example, the temperature of a resonant sensor can affect the resonance frequency of the resonant sensor. In such an example, the resonance frequency is indicative of the temperature.

Some methods to determine a resonance frequency rely on measuring different properties of the resonant sensors, such as resonance frequency, oscillation amplitude, and phase delay associated with the resonant sensor. Specifically, some methods rely on frequency counters to determine the resonance frequency of a resonant sensor. The frequency counters count the number of cycles of oscillation over a fixed period of time. However, these methods require an increase in monitoring time to determine the resonance frequency with high accuracy. This increased measurement time corresponds to increased power consumption and require additional components to determine the resonance frequency.

Resonant sensors include many intrinsic properties such as, among other things, group delay. Group delay is related to the time it takes for the envelope of a signal with variable amplitude to pass through a network (e.g., a resonant sensor). In the example of a resonant sensor, group delay is related to the resonance frequency. As the resonance frequency is related to physical quantities monitored by the resonant sensor, the group delay is additionally related to the physical quantities monitored by the resonant sensor.

In contrast to directly monitoring resonance frequency, examples disclosed herein determine resonance frequency and quality factor by monitoring group delay. An example apparatus to measure resonant sensors based on detection of group delay includes a modulation manager configured to query the resonant sensor with a modulated signal including a frequency; and a resonance determiner configured to determine a resonance frequency of the resonant sensor based on a group delay associated with the resonant sensor and the frequency.

Examples disclosed herein provide high resolution measurements of resonant sensors in a reduced amount of time without increasing power consumption or increasing components used to monitor the resonant sensor. The examples disclosed herein provide for a resonant sensor system that detects resonance frequencies of resonant sensors based on changes in group delays associated with the resonant sensors. Because the examples disclosed herein utilize the group delay of resonant sensors, the resonant sensor system disclosed herein is highly sensitive. The functionality to step the frequency of the query signal allows for fast interrogation and an extended linearity (e.g., high linearity) of the resonant sensors. The examples disclosed herein are not limited by the upper threshold and lower threshold group delays corresponding to the linear region of a resonant sensor because the measurement frequency can be adjusted to extend the range of linearity of the resonant sensors. As used herein, the term "coupled" is defined as connected directly or indirectly (e.g., through one or more intervening structures and/or layers, such as resistors, capacitors, inductors, transistors, voltage clamps, switches, buffers amplifiers, etc.).

FIG. 1 is a schematic illustration of an example resonant sensor system 100. The resonant sensor system 100 includes an example sensor interrogator 102, an example first resonant sensor 104 $R_1$, an example second resonant sensor 106 $R_2$, an example nth resonant sensor 108 $R_n$, and an example computing system 110. While three resonant sensors are shown in the resonant sensor system 100 (the first resonant sensor 104, the second resonant sensor 106, and the nth resonant sensor 108), any number of resonant sensors may be included in the resonant sensor system 100.

In example illustrated in FIG. 1, the sensor interrogator 102 is coupled to the first resonant sensor 104, the second resonant sensor 106, and the nth resonant sensor 108. The sensor interrogator 102 may be coupled to any combination of the first resonant sensor 104, second resonant sensor 106, and the nth resonant sensor 108 by wired and/or wireless coupling. Each of the first resonant sensor 104, the second resonant sensor 106, and the nth resonant sensor 108 are coupled to the sensor interrogator 102. For example, any of the first resonant sensor 104, the second resonant sensor 106, and the nth resonant sensor 108 may be coupled to the sensor interrogator 102 via a wireless connection, a wired connection, and/or a combination of wired and wireless connections.

In the example of FIG. 1, the sensor interrogator 102 is a device that queries one or more of the first resonant sensor 104, the second resonant sensor 106, or the nth resonant sensor 108. The sensor interrogator 102 may query resonant sensors via wired or wireless communication. Upon receiving one or more signals from one or more of the first resonant sensor 104, the second resonant sensor 106, or the nth resonant sensor 108, the sensor interrogator 102 determines a group delay associated with a resonant sensor of interest. For example, if the sensor interrogator 102 queries the first resonant sensor 104, upon receiving one or more signals from the first resonant sensor 104, the sensor interrogator 102 determines a group delay associated with the first resonant sensor 104. Based on the group delay associated with first resonant sensor 104, the sensor interrogator 102 determines the resonance frequency of the first resonance sensor 104.

In the illustrated example of FIG. 1, each of the first resonant sensor 104, the second resonant sensor 106, and the nth resonant sensor 108 is a resonant sensor that monitors a physical quantity (e.g., temperature, pressure, humidity, etc.) associated with an environment in which the resonant sensor system is located or near. For example, the first resonant sensor 104 may measure pressure in a chamber. In such an example, the first resonant sensor 104 may be a piezo-electric based cantilever resonant sensor. In other examples, each of the first resonant sensor 104, the second resonant sensor 106, and the nth resonant sensor 108 may be any combination of piezo-electric, acoustic, cavity, and/or other approaches to resonant sensors. In examples disclosed herein, each of the first resonant sensor 104, the second resonant sensor 106, and the nth resonant sensor 108 may operate at the same or different frequencies from one another.

In the example of FIG. 1, regardless of the resonant sensor used for each of the first resonant sensor 104, the second resonant sensor 106, and the nth resonant sensor 108, each of the first resonant sensor 104, the second resonant sensor 106, and the nth resonant sensor 108, exhibits an associated group delay. Group delay corresponds to the duration of time associated with the amplitude envelope of a signal formed by several sinusoidal components as it passes through a network. In some examples disclosed herein, group delay refers to the duration of time that an amplitude modulated signal (e.g., a query signal) from the sensor interrogator 102 takes to pass through a resonant sensor (e.g., the first resonant sensor 104, the second resonant sensor 106, and the nth resonant sensor 108). Additionally, as the resonance frequency of one or more of the first resonant sensor 104, the second resonant sensor 106, and the nth resonant sensor 108 varies, the group delay of one or more of the first resonant sensor 104, the second resonant sensor 106, and the nth resonant sensor 108 includes a non-linear distribution. A resonant sensor (e.g., the first resonant sensor 104, the second resonant sensor 106, and the nth resonant sensor 108, etc.) includes many different distributions depending on the frequency of the query signal used to query the resonant sensor.

In the example of FIG. 1, the computing system 110 is a device or system that receives the resonance frequency of one or more of the first resonant sensor 104, the second resonant sensor 106, and the nth resonant sensor 108. In the example of FIG. 1, the computing system 110 is a remote device that may act on the environment in which the resonant sensor system 100 is located or near. For example, the computing system 110 may be a controller. In other examples, the computing system 110 may be a workstation, a laptop computer, a desktop computer, or any other suitable computing system. For example, if the first resonant sensor 104 is monitoring the pressure of a chamber, in response to determining the resonance frequency of the first resonant sensor 104 (e.g., the pressure of the chamber), the sensor interrogator 102 transmits the resonance frequency to computing system 110. In such an example, the computing system 110 may act on the chamber to adjust the pressure and or other characteristics of the chamber to ensure that the pressure is in a desired range according to design preferences.

Figure 2:
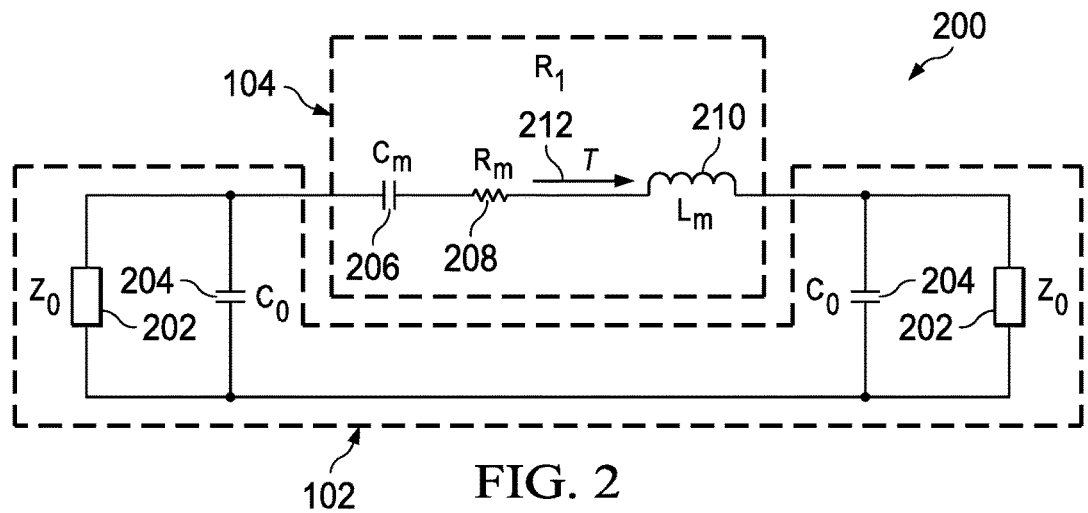
FIG. 2 is circuit representation illustrating a two-port configuration to connect a resonant sensor to the sensor interrogator of FIG. 1.

FIG. 2 is a circuit representation 200 illustrating a two-port configuration to connect a resonant sensor to the sensor interrogator 102 of FIG. 1. The circuit representation 200 includes an example first impedance 202 $Z_0$, an example first capacitor 204 $C_0$, an example second capacitor 206 $C_M$, an example resistor 208 $R_M$, an example inductor 210 $L_M$, and an example query signal (line 212).

In the example of FIG. 2, the impedance 202 represents an impedance model of the sensor interrogator 102 of FIG. 1. Collectively, the first capacitance 204, second capacitor 206, the resistor 208, and the inductor 210 represent an impedance model of the first resonant sensor 104 $R_1$. The first capacitance 204 and the impedance 202 are present at both the connection to the second capacitor 206 and the inductor 210. The query signal (line 212) is based on a transmission coefficient (T).

In the illustrated example of FIG. 2, the impedance 202 and the first capacitor 204 are coupled in parallel. The parallel coupled impedance 202 and first capacitor 204 are coupled in series to the second capacitor 206. The second capacitor 206 is coupled in series with the resistor 208 and the inductor 210. The first capacitor 204 and the impedance 202 are coupled in parallel. The parallel coupled first capacitor 204 and impedance 202 are coupled in series with the inductor 210.

In the example of FIG. 2, the group delay associated with the query signal (line 212) transmitting through the first resonant sensor 104 is based on the impedance values of the first capacitor 204, the second capacitor 206, the resistor 208, and the inductor 210. The group delay associated with the first resonant sensor 104 is determined from the transmission coefficient (T) that relates to the ratio of transmitted to incident voltages of the first resonant sensor 104. In the example of FIG. 2, the transmission coefficient (T) of the first resonant sensor 104 is shown below in equation 1. Equation 1 is defined under the assumption that the impedance 202 is a high impedance node $$\left(|Z_0| \gg \frac{1}{\omega C_0}\right).$$

$$T(j\omega) = \frac{\dfrac{C_M}{C_0}}{-\omega^2 L_m C_M + j\omega R_M C_M + \dfrac{C_M + C_0}{C_0}} \quad \text{Equation-1}$$

The group delay $\phi_r$ associated with the first resonant sensor 104 is determined as the derivative of the phase angle of the first resonant sensor 104 with respect to the radian representation of the frequency of oscillation ($\omega$) and is shown below in equation 2:

$$\phi_r = \frac{d\angle T(j\omega)}{d\omega} = \frac{\dfrac{\omega^2}{\omega_r^3 Q} + \dfrac{1}{\omega_r Q} \dfrac{C_M + C_0}{C_0}}{\left[\dfrac{\omega^2}{\omega_r^2} - \dfrac{C_M + C_0}{C_0}\right]^2 + \left[\dfrac{\omega}{\omega_r Q}\right]^2} \quad \text{Equation-2}$$

In equation 2, the term $$\omega_r = \frac{1}{\sqrt{L_M C_M}}$$

represents the radian representation of the resonance frequency ($f_r$) and $$Q = \frac{1}{\omega_r R_M C_M}$$

represents me quality factor of the first resonant sensor 104. When the frequency of oscillation coincides with the resonance frequency of the first resonant sensor 104 ($\omega = \omega_r$) and under the assumption that $$\frac{C_M + C_0}{C_0} = 0$$

equation 2 can be rewritten below as equation 3.

$$\phi_r = \frac{2L_M}{R_M} = \frac{2Q}{\omega_r} \quad \text{Equation-3}$$

In the example of FIG. 2, the group delay $\phi_r$ associated with the first resonant sensor 104 is on the scale of microseconds (μs) when Q is on the order of thousands and resonant frequency is on the order of hundreds of MHz or GHz. Because the group delay $\phi_r$ associated with the first resonant sensor 104 is on the scale of μs, measuring the group delay $\phi_r$ with the sensor interrogator 102, increases the sensitivity of the first resonant sensor 104. While a two-port configuration including shunt capacitance to connect a resonant sensor to the sensor interrogator 102 of FIG. 1 is shown in FIG. 2, other configurations are possible. In additional examples, a one-port configuration may be used to connect a resonant sensor to the sensor interrogator 102 of FIG. 1. In further examples, a two-port configuration including feedthrough capacitance may also be used to connect a resonant sensor to the sensor interrogate 102 of FIG. 1.

Figure 3:
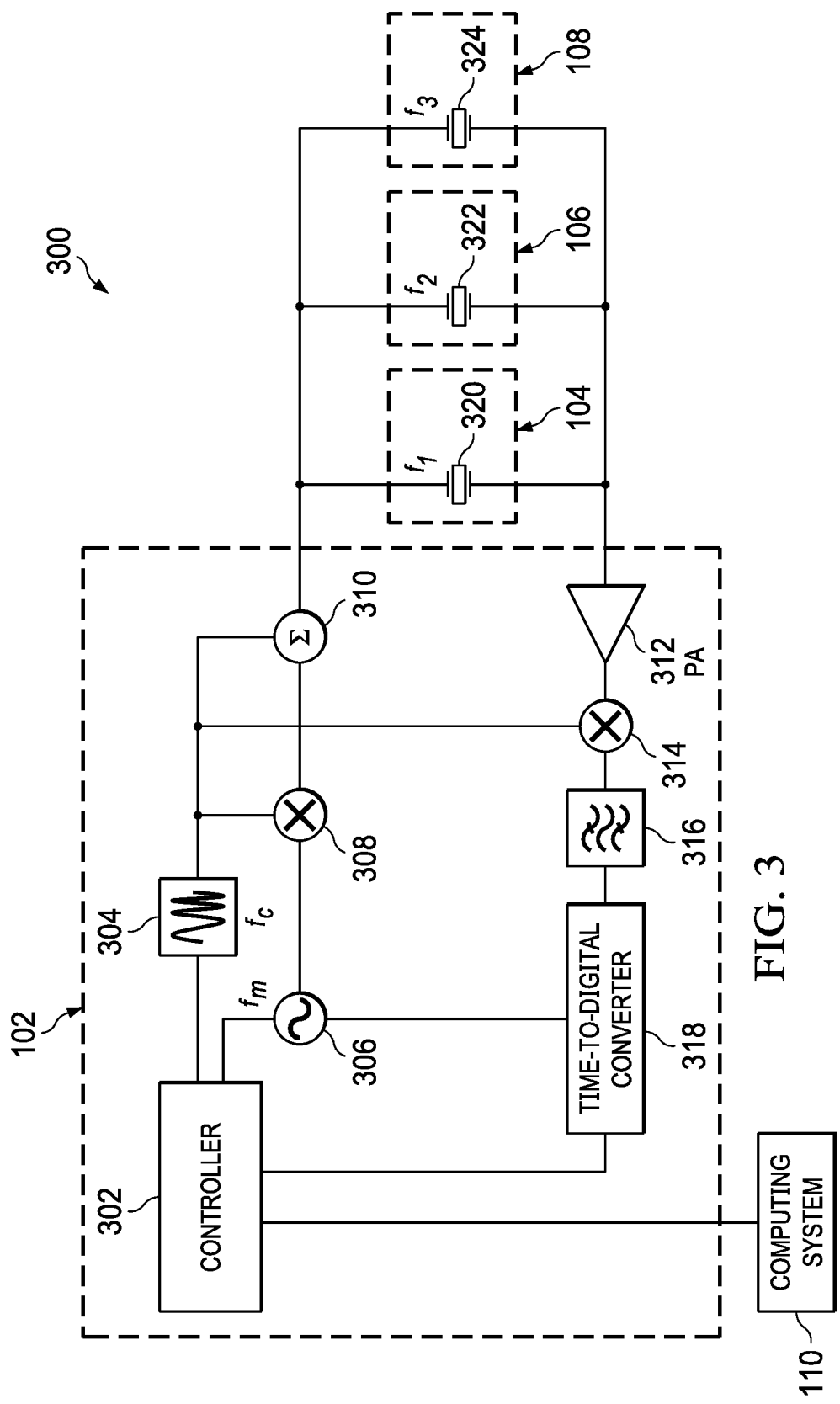
FIG. 3 is a schematic illustration of the resonant sensor system of FIG. 1 in a wired configuration.

FIG. 3 is a schematic illustration 300 of the resonant sensor system 100 of FIG. 1 in a wired configuration. The schematic illustration 300 includes an example controller 302, an example voltage controlled oscillator (VCO) 304, an example modulating oscillator 306, an example first mixer 308, an example adder 310, an example amplifier 312, an example second mixer 314, an example intermediate frequency filter 316, an example time-to-digital converter (TDC) 318, an example first acoustic resonant sensor 320, an example second acoustic resonant sensor 322, an example third acoustic resonant sensor 324, and the example computing system 110. In the example of FIG. 3, the controller 302, the VCO 304, the modulating oscillator 306, the first mixer 308, the adder 310, the amplifier 312, the second mixer 314, the intermediate frequency filter 316, and the TDC 318 represent the sensor interrogator 102 of FIG. 1. The first acoustic resonant sensor 320 represents the first resonant sensor 104, the second acoustic resonant sensor 322 represents the second resonant sensor 106, and the third acoustic resonant sensor 324 represents the nth resonant sensor 108. While three acoustic resonant sensors are shown in FIG. 3 (the first acoustic resonant sensor 320, the second acoustic resonant sensor 322, and the third acoustic resonant sensor 324), any number of resonant sensors and any type of resonant sensor may be included in the resonant sensor system 100 as it is illustrated in FIG. 3.

In the example of FIG. 3, the controller 302 is coupled to the VCO 304, the modulation oscillator 306, the TDC 318, and the computing system 110. The controller 302 is, for example, a microcontroller. In other examples, the controller 302 may be a state machine. In the example of FIG. 3, the controller 302 is configured to transmit query signals to one or more of the first acoustic resonant sensor 320, the second acoustic resonant sensor 322, or the third acoustic resonant sensor 324 by controlling the VCO 304. For example, the controller 302 tunes the oscillation frequency of the VCO 304 based on the group delay measured by the TDC 318. The controller 302 may be additionally configured to adjust the amplitude of the signal generated by the modulation oscillator 306. The controller 302 additionally transmits a signal to the computing system 110. In some examples, the controller 302 may transmit an analog signal to the computing system 110 while in additional or alternative examples, the controller 302 may transmit a digital signal to the computing system 110.

In the example of FIG. 3, after receiving a response from one or more of the first acoustic resonant sensor 320, the second acoustic resonant sensor 322, or the third acoustic resonant sensor 324, the controller 302 determines the resonance frequency of one or more of the first acoustic resonant sensor 320, the second acoustic resonant sensor 322, or the third acoustic resonant sensor 324. For example, a query signal to one of the first acoustic resonant sensor 320, the second acoustic resonant sensor 322, or the third acoustic resonant sensor 324 is based on a range of frequencies at which each of the first acoustic resonant sensor 320, the second acoustic resonant sensor 322, or the third acoustic resonant sensor 324 may operate. For example, a query signal to the first acoustic resonance sensor 320 is between a frequency of 2.48 gigahertz (GHz) and 2.52 GHz while a query signal to the second acoustic resonance sensor 322 is between a frequency of 2.08 GHz and 2.12 GHz.

In the illustrated example of FIG. 3, the VCO 304 is coupled to controller 302, the first mixer 308, the adder 310, and the second mixer 314. The VCO 304 is an oscillator that generates a frequency based on an input voltage. Herein the frequency generated by the VCO 304 is referred as carrier frequency ($f_c$).

In the example of FIG. 3, the modulation oscillator 306 is coupled to the controller 302, the first mixer 308, and the TDC 318. The modulation oscillator 306 is, for example, a resistor-capacitor (RC) oscillator. In other examples, the modulation oscillator 306 is an inductor-capacitor (LC) oscillator, a crystal oscillator, an Armstrong oscillator, or any other suitable oscillator. In additional or alternative examples, the modulation oscillator 306 is a frequency divider coupled to the output of the VCO 304 that produces a smaller frequency than the carrier frequency. The modulation oscillator 306 is configured to generate a signal (e.g., a modulating signal) to modulate the signal generated by the VCO 304. The frequency of operation of the modulation oscillator 306 is selected based on design specifications. Herein, the frequency of operation of the modulation oscillator 306 is referred to as the modulation frequency ($f_m$). In the example of FIG. 3, the modulation frequency is 250 kilohertz (kHz). In some examples disclosed herein, the modulation frequency is selected so that the period of the signal generated by the modulation oscillator 306 is greater than the time constant associated with all or the first acoustic resonant sensor 320, the second acoustic resonant sensor 322, and the third acoustic resonant sensor 324. Additionally, the amplitude of the signal generated by the modulation oscillator 306 is adjustable based on a signal received from the controller 302.

In the example illustrated in FIG. 3, the first mixer 308 is a frequency mixer. The first mixer 308 is coupled to the VCO 304, the modulation oscillator 306, and the adder 310. The first mixer 308 multiplies the signal generated by the VCO 304 and the signal generated by the modulation oscillator 306. The first mixer 308, as a result of mixing the signal generated by the VCO 304 and the modulation oscillator 306, generates a modulated signal that oscillates at the frequency of the VCO 304 and has an amplitude that tracks the amplitude of the signal generated by the modulation oscillator 306.

In the illustrated example of FIG. 3, the adder 310 is a signal combiner. The adder 310 is coupled to the VCO 304, the first mixer 308, the first acoustic resonant sensor 320, the second acoustic resonant sensor 322, and the third acoustic resonant sensor 324. The adder 310 adds the signal generated by the VCO 304 and the signal generated by the first mixer 308. The resultant signal generated by the adder 310 has an increased amplitude, and a phase shift of 45° as compared to the signal generated by the VCO 304.

In the example of FIG. 3, the amplifier 312 is a power amplifier that is utilized to amplify responses from one or more of the first acoustic resonant sensor 320, the second acoustic resonant sensor 322, or the third acoustic resonant sensor 324 that are attenuated. The amplifier 312 is coupled to second mixer 314, the first acoustic resonant sensor 320, the second acoustic resonant sensor 322, and the third acoustic resonant sensor 324. For example, the amplifier 312 is an electronic amplifier that converts a low-power radio frequency signal from one or more of the first acoustic resonant sensor 320, the second acoustic resonant sensor 322, and the third acoustic resonant sensor 324 to a higher power signal to be sent to second mixer 314. In additional or alternative examples, the amplifier 312 may be a low noise amplifier, or the amplifier 312 may be a unity gain amplifier.

In the example illustrated in FIG. 3, the second mixer 314 is a frequency mixer. The second mixer 314 is coupled to the VCO 304, the amplifier 312, and the intermediate frequency filter 316. The second mixer 314 multiplies the signal generated by the VCO 304 by the signal generated by the amplifier 312. The second mixer 314, as a result of mixing the signal generated by the VCO 304 and the amplifier 312, generates a demodulated signal that oscillates at double the carrier frequency used by the controller 302 to query one or more of the first acoustic resonant sensor 320, the second acoustic resonant sensor 322, or the third acoustic resonant sensor 324. In addition, the signal will include a sinusoidal component that oscillates at the modulation frequency ($f_m$) and can be used to determine the group delay associated with one of the first acoustic resonant sensor 320, the second acoustic resonant sensor 322, and the third acoustic resonant sensor 324, depending on which of the first acoustic resonant sensor 320, the second acoustic resonant sensor 322, and the third acoustic resonant sensor 324 the controller 302 queries.

In the example of FIG. 3, the intermediate frequency filter 316 is a bandpass filter. The intermediate frequency filter 316 is coupled to the second mixer 314 and the TDC 318. In the example of FIG. 3, the intermediate frequency filter 316 is an LC filter. In the example of FIG. 3, the time constant of the intermediate frequency filter 316 sets the overall time response of the sensor interrogator 102. The TDC 318 is coupled to the controller 302, the modulation oscillator 306, and the intermediate frequency filter 316. The TDC 318 is a device that generates a digital representation of the time delay that exists between two input signals oscillating at the same frequency. The TDC 318 compares the signal received from the intermediate frequency filter 316 with the signal generated by the modulation oscillator 306. The TDC 318 determines the time delay between the signal received from the intermediate frequency filter 316 and the modulation oscillator 306 as well as the polarity of the time delay. In the example of FIG. 3, the signal generated by the TDC 318 includes information describing the time delay between the signal generated by the modulation oscillator 306 and the signal received from the intermediate frequency filter 316 (e.g., the group delay) as well as information describing the polarity of the group delay associated with one or more of the first acoustic resonant sensor 320, the second acoustic resonant sensor 322, or the third acoustic resonant sensor 324. In the example of FIG. 3, the resolution of the resonant sensor system 100 is set by the resolution of the TDC 318. The TDC 318 relies on the high frequency of operation (e.g., an internal oscillator that operates at a high frequency) to capture small time delays and achieve a high resolution.

In the example illustrated in FIG. 3, the first acoustic resonant sensor 320 includes a first resonance frequency, $f_1$. The first acoustic resonant sensor 320 is coupled to the adder 310 and the amplifier 312. In the example of FIG. 3, the first acoustic resonant sensor 320 includes a range of frequency operation between 2.48 GHz and 2.52 GHz. The second acoustic resonant sensor 322 includes a second resonance frequency, $f_2$. The second acoustic resonant sensor 322 is coupled to the adder 310 and the amplifier 312. In the example of FIG. 3, the second acoustic resonant sensor 322 includes a range of frequency operation between a frequency of 2.08 GHz and 2.12 GHz. The third acoustic resonant sensor 324 includes a third resonance frequency, $f_3$. The third acoustic resonant sensor 324 is coupled to the adder 310 and the amplifier 312. In the example of FIG. 3, the third acoustic resonant sensor 324 includes a range of frequency operation between a frequency of 2.88 GHz and 2.92 GHz.

In the illustrated example of FIG. 3, in operation, the controller 302 queries, or is configured to query, one or more of the first acoustic resonant sensor 320, the second acoustic resonant sensor 322, and the third acoustic resonant sensor 324 with a query signal. The query signal generated in response to the controller 302 is amplitude modulated at the first mixer 308 and the adder 310 before being sent to one the first acoustic resonant sensor 320, the second acoustic resonant sensor 322, and the third acoustic resonant sensor 324. After receiving the response to the query signal from one or more of the first acoustic resonant sensor 320, the second acoustic resonant sensor 322, and the third acoustic resonant sensor 324, the response to the query signal is demodulated at the second mixer 314. The group delay of one or more of the first acoustic resonant sensor 320, the second acoustic resonant sensor 322, and the third acoustic resonant sensor 324 is detected by the TDC 318. After determining the group delay and associated polarity of one or more of the first acoustic resonant sensor 320, the second acoustic resonant sensor 322, and the third acoustic resonant sensor 324 based on the signal output from the TDC 318, the controller 302 determines whether the frequency of operation of the VCO 304 is to be adjusted or not to be adjusted to determine the resonance frequency of one or more of the first acoustic resonant sensor 320, the second acoustic resonant sensor 322, and the third acoustic resonant sensor 324.

In the example of FIG. 3, if the frequency of operation of the VCO 304 is to be adjusted, the controller 302 queries one or more of the first acoustic resonant sensor 320, the second acoustic resonant sensor 322, and the third acoustic resonant sensor 324 to determine the resonance frequency of one or more of the first acoustic resonant sensor 320, the second acoustic resonant sensor 322, and the third acoustic resonant sensor 324. After determining the resonance frequency of one or more the first acoustic resonant sensor 320, the second acoustic resonant sensor 322, and the third acoustic resonant sensor 324, the controller 302 transmits the resonance frequency of the respective acoustic resonant sensors to the computing system 110. The computing system 110 may be used to adjust the environment that the resonant sensor system 100 is located in or near in order to ensure the values measured by each of the first acoustic resonant sensor 320, the second acoustic resonant sensor 322, and the third acoustic resonant sensor 324 are within a desired range according to design preferences. In the example of FIG. 3, because the time response of the sensor interrogator 102 is set by the time constant of the intermediate frequency filter 316 and the period of the modulation signal ($T_m$) and the resolution of the resonant sensor system 100 is determined by the resolution of the TDC 318, the time response and resolution of the resonant sensor system 100 are not dependent on one another.

In the illustrated example of FIG. 3, the controller 302, the VCO 304, the modulation oscillator 306, the first mixer 308, the adder 310, the amplifier 312, the second mixer 314, the intermediate frequency filter 316, and the TDC 318, are implemented on a first die (e.g., a first silicon die) and the first acoustic resonant sensor 320, the second acoustic resonant sensor 322, and the third acoustic resonant sensor 324 may be implemented on a second die (e.g., a second silicon die) or on the first die (e.g., the first silicon die). Alternatively, in some examples, the controller 302 and the VCO 304 of FIG. 3 may be combined into the same die and/or otherwise included in the same die while the modulation oscillator 306, the first mixer 308, the adder 310, the amplifier 312, the second mixer 314, the intermediate frequency filter 316, and the TDC 318 are implemented on a different die or different dies.

Figure 4:
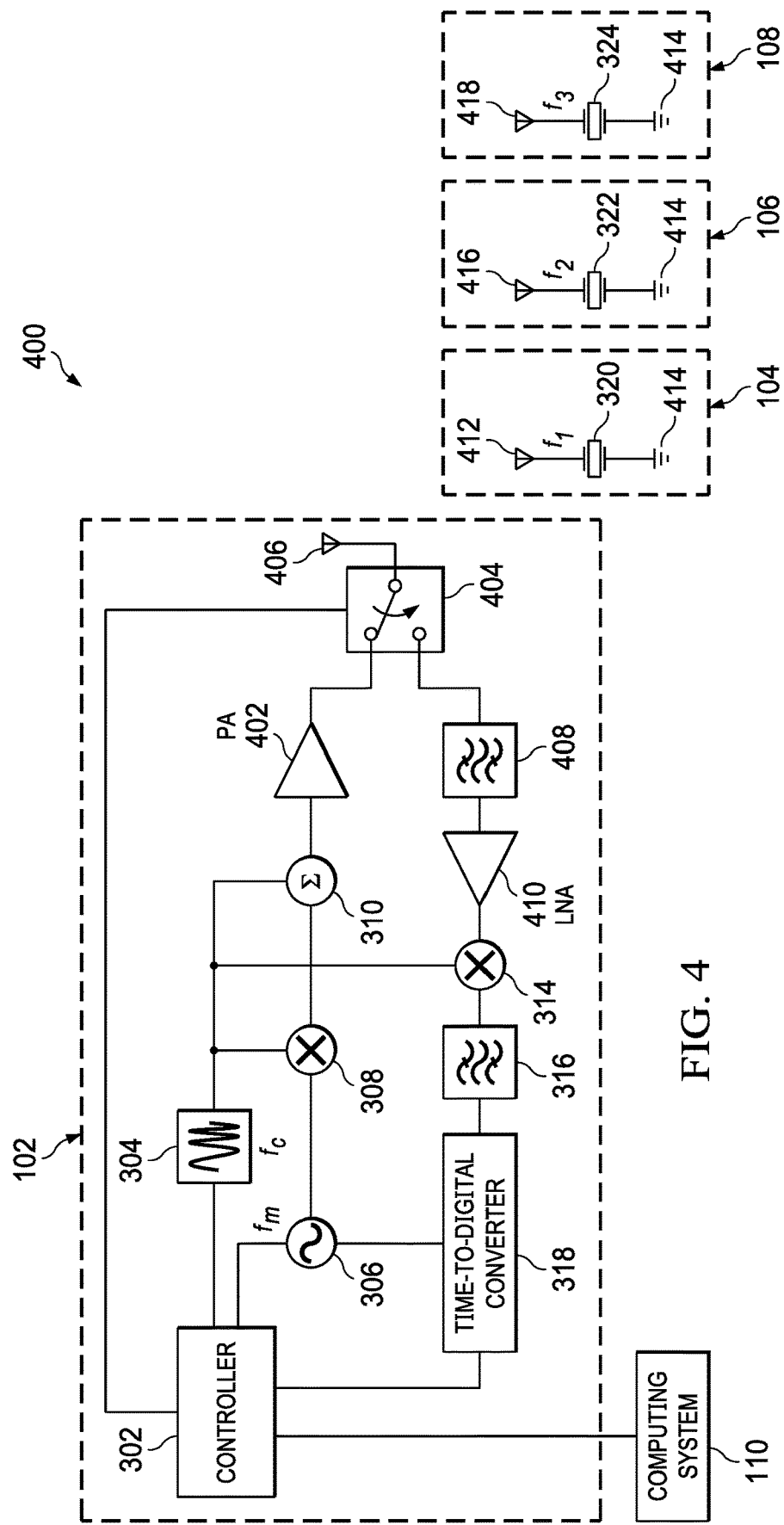
FIG. 4 is a schematic illustration of the resonant sensor system of FIG. 1 in a wireless configuration.

FIG. 4 is a schematic illustration 400 of the resonant sensor system 100 of FIG. 1 in a wireless configuration. The schematic illustration 400 includes the example controller 302, the example VCO 304, the example modulation oscillator 306, the example first mixer 308, the example adder 310, an example first amplifier 402, an example switch 404, an first example antenna 406, an example radio frequency filter 408, an example second amplifier 410, the example second mixer 314, the example intermediate frequency filter 316, the example TDC 318. The example schematic illustration 400 further includes an example second antenna 412, the example first acoustic resonant sensor 320, a ground node 414, an example third antenna 416, the example second acoustic resonant sensor 322, an example fourth antenna 418, and the example third acoustic resonant sensor 324. While three acoustic resonant sensors are shown in FIG. 4 (the first acoustic resonant sensor 320, the second acoustic resonant sensor 322, and the third acoustic resonant sensor 324), any number of resonant sensors and any type of resonant sensor may be included in the resonant sensor system 100 as it is illustrated in FIG. 4.

In the example of FIG. 4, the controller 302 is further coupled to the switch 404. In FIG. 4, the controller 302 additionally determines whether to transmit or receive signals. For example, after generating a signal at the VCO 304 and transmitting the signal via the first antenna 406, the controller 302 toggles the switch 404 to connect the first antenna to the radio frequency filter 408. The first amplifier 402 is coupled to the adder 310 and the switch 404. The first amplifier 402 is a power amplifier. For example, the first amplifier 402 is an electronic amplifier that amplifies the low-power radio frequency signal from the adder 310 to be transmitted to one or more of the first acoustic resonant sensor 320, the second acoustic resonant sensor 322, and the third acoustic resonant sensor 324 as a high power signal to be sent from the first antenna 406.

In the example of FIG. 4, the switch 404 is coupled to the first amplifier 402, the first antenna 406, the radio frequency filter 408, and the controller 302. The switch 404 is a device that is configured to be controlled to connect the first amplifier 402 to the first antenna 406 or to connect the first antenna 406 to the radio frequency filter 408. In the example of FIG. 4, the switch 404 is a two-to-one multiplexor. The first antenna 406 is coupled to the switch 404 and communicatively coupled to the second antenna 412, the third antenna 416, and the fourth antenna 418. The first antenna 406 is, for example, a spiral antenna. In other examples, the first antenna 406 may be a fractal antenna, a tunable slot antenna, or other suitable antenna.

In the example illustrated in FIG. 4, the radio frequency filter 408 is coupled to the switch 404 and the second amplifier 410. The radio frequency filter 408 is a bandpass filter. For example, the radio frequency filter 408 is an LC tank. In other examples, the radio frequency filter 408 is an acoustic filter. The radio frequency filter 408 filters unwanted frequencies from the response to the query signal from one or more of the first acoustic resonant sensor 320, the second acoustic resonant sensor 322, or the third acoustic resonant sensor 324. The second amplifier 410 is coupled to the radio frequency filter 408 and the second mixer 314. The second amplifier 410 is a low noise amplifier. For example, the second amplifier 410 is an electronic amplifier that amplifies a low-power signal from the radio frequency filter 408 without significantly degrading the signal-to-noise ratio (SNR) of the signal from the radio frequency filter 408. The output of the second amplifier 410 is to be transmitted to the second mixer 314.

In the example illustrated in FIG. 4, the second antenna 412 is coupled to the first acoustic resonant sensor 320 and communicatively coupled to the first antenna 406. The second antenna 412 is, for example, a spiral antenna. In other examples, the second antenna 412 may be a fractal antenna, a tunable slot antenna, or other suitable antenna. The ground node 414 is coupled to the first acoustic resonant sensor 320, the second acoustic resonant sensor 322, and the third acoustic resonant sensor 324. The ground node 414 is a reference point from which voltages are measured.

In the example of FIG. 4, the third antenna 416 is coupled to the second acoustic resonant sensor 322 and communicatively coupled to the first antenna 406. The third antenna 416 is, for example, a spiral antenna. In other examples, the third antenna 416 may be a fractal antenna, a tunable slot antenna, or other suitable antenna. The fourth antenna 418 is coupled to the third acoustic resonant sensor 324 and communicatively coupled to the first antenna 406. The fourth antenna 418 is, for example, a spiral antenna. In other examples, the fourth antenna 418 may be a fractal antenna, a tunable slot antenna, or other suitable antenna. The first acoustic resonant sensor 320 of FIG. 4 is coupled to the second antenna 412 and the ground node 414. The second acoustic resonant sensor 322 of FIG. 4 is coupled to the third antenna 416 and the ground node 414. The third acoustic resonant sensor 324 of FIG. 4 is coupled to the fourth antenna 418 and the ground node 414.

In the example illustrated in FIG. 4, each of the second antenna 412, the third antenna 416, and the fourth antenna 418 receive query signals from the sensor interrogator 102 sent via the first antenna 406. Each of the first acoustic resonant sensor 320, the second acoustic resonant sensor 322, and the third acoustic resonant sensor 324 transmit responses to the query signal to the first antenna 406 via the second antenna 412, the third antenna 416, and the fourth antenna 418, respectively.

In the illustrated example of FIG. 4, the controller 302, the VCO 304, the modulation oscillator 306, the first mixer 308, the adder 310, the first amplifier 402, the switch 404, the first antenna 406, the radio frequency filter 408, the second amplifier 410, the second mixer 314, the intermediate frequency filter 316, and the TDC 318, are implemented on a first die (e.g., a first silicon die) and the first acoustic resonant sensor 320, the second acoustic resonant sensor 322, and the third acoustic resonant sensor 324 are implemented on a second die (e.g., a second silicon die) together with the second antenna 412, the third antenna 416, the fourth antenna 418, or separated from the second antenna 412, the third antenna 416, and the fourth antenna 418. In such an example where the second antenna 412, the third antenna 416, and the fourth antenna 418 are not implemented on the second die the first acoustic resonant sensor 320, the second acoustic resonant sensor 322, and the third acoustic resonant sensor 324 will be connected to the second antenna 412, the third antenna 416, and the fourth antenna 418, respectively, by using wires, flip-chip interconnections, or near-field inductive couplers. Alternatively, in some examples, the controller 302 and the VCO 304 of FIG. 4 may be combined into the same die and/or otherwise included in the same die while the modulation oscillator 306, the first mixer 308, the adder 310, the first amplifier 402, the switch 404, the first antenna 406, the radio frequency filter 408, the second amplifier 410, the second mixer 314, the intermediate frequency filter 316, and the TDC 318 are implemented on a different die or different dies.

Figure 5:
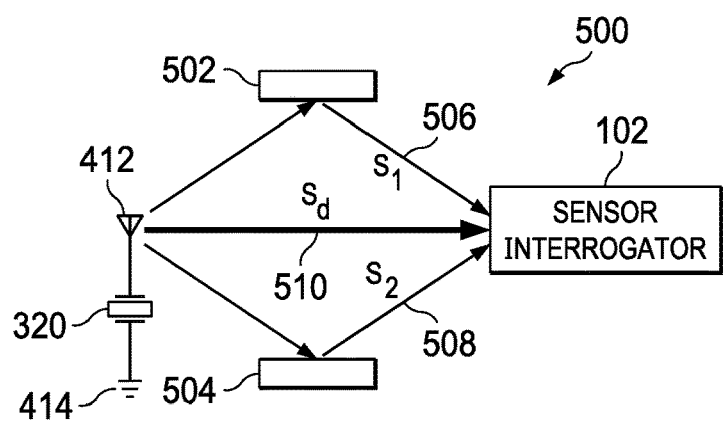
FIG. 5 is a schematic illustration showing multipath effects when interrogating a resonant sensor of the resonant sensor system illustrated in FIG. 4

FIG. 5 is a schematic illustration 500 showing multipath effects when interrogating a resonant sensor of the resonant sensor system illustrated in FIG. 4. The schematic illustration 500 includes the example sensor interrogator 102, the example second antenna 412, the example first acoustic resonant sensor 320, the example ground node 414, an example first surface 502, an example second surface 504, an example first path response $S_1$ (line 506), an example second path response $S_2$ (line 508), and an example direct path response $S_d$ (line 510). The sensor interrogator 102 is communicatively coupled to the second antenna 412. The second antenna 412 is coupled to the first acoustic resonant sensor 320 and communicatively coupled to the sensor interrogator 102. The first acoustic resonant sensor 320 is coupled to the second antenna 412 and the ground node 414.

In the illustrated example of FIG. 5, the schematic illustration 500 shows the response from the first acoustic resonant sensor 320 to a query signal as the response reflects off the first surface 502 (line 506) and the second surface 504 (line 508). As a result of the reflection, each of the responses to the query signal reflecting off of the first surface 502 and the second surface 504 experiences a delay respectively. Despite the multiple paths that the response to the query signal can travel, the overall response can be modeled after being received by the sensor interrogator and demodulated as shown below in equation 4:

$$\text{Response}=a(t)(S_d(t)+S_1(t)+S_2(t))S_d(t)=a(t)[\sin(\omega_c t)+\sin(\omega_c t+\phi_1)+\sin(\omega_c t+\phi_2)]\sin(\omega_c t) \quad \text{Equation-4}$$

In the example of FIG. 5, in equation 4, the term $\omega_c$ represents the radian representation of the frequency, $f_c$, of the signal generated by the sensor interrogator 102. The terms $\phi_1$ and $\phi_2$ represent the phase delay of the response to the query signal as it reflects of the first surface 502 and the second surface 504, respectively. The term a(t) represents frequency response of the first acoustic resonant sensor 320 and is defined by equation 5 below:

$$a(t)=[b_1+b_2\sin(\omega_m t+\phi_r)+a_1 b_2\sin(\omega_m t+\phi_r+\phi_2)+a_2 b_2\sin(\omega_m t+\phi_r+\phi_2)] \quad \text{Equation-5}$$

In the example of FIG. 5, equation 5 is a Fourier series representation of the frequency response of the first acoustic resonant sensor 320. In equation 5, the terms $b_1$ and $b_2$ represent amplification that is applied to the signal generated by the VCO 304 and the signal generated by the modulation oscillator 306, respectively. In equation 5, the term $\omega_m$ is the radian representation of the modulation frequency, $f_m$, of the signal generated by the modulator oscillator 306, each of the terms, $a_1$ and $a_2$ represent constants associated with the specific characteristics of the various path responses, and the term $\phi_r$ represents the group delay of the first acoustic resonant sensor 320. By applying trigonometric identities, equation 5 can be written as shown in equation 6 below:

$$\text{Response} = \frac{1+\cos(\phi_1+\phi_2)}{2}[b_1 + \sqrt{A^2+B^2}\cos(\omega_r t + \phi_r - a)] \quad \text{Equation-6}$$

In the example of FIG. 5, in equation 6, the term A and B are cosine and sine functions of the phase delays associated with every path, respectively, and are defined further in connection with equations 7 and 8 below. The term a represents an aggregate of all the phase delays introduced into the response to the query signal that reflects off the first surface 502 and the second surface 504. The term a is defined by equation 9 below:

$$A=b_2[1+a_1\cos(\phi_1)+a_2\cos(\phi_2)] \quad \text{Equation-7}$$

$$B=b_2[a_1\sin(\phi_1)+a_2\sin(\phi_2)] \quad \text{Equation-8}$$

$$a = \tan^{-1}\left(\frac{B}{A}\right)+\theta \quad \text{Equation-9}$$

In the example of FIG. 5, in equation 9, the term θ is a function of the geometric angle between the cosine and sine components of equation 7 and equation 8, respectively, and becomes 0° when the angle B/A falls into the $1^{st}$ and $4^{th}$ quadrants and 180° when the angle B/A falls into the $2^{nd}$ and $3^{rd}$ quadrants. The group delay of a signal that reflects off the first surface 502 and the second surface 504 includes the delay introduced into the response to the query signal that reflects off the first surface 502 and the second surface 504 and is shown in equation 8 below:

$$\phi_{r\text{ and reflections}}=\phi_r-a \quad \text{Equation-10}$$

FIG. 6 is a block diagram illustrating an example of the controller 302 of FIG. 3 and FIG. 4. The controller 302 includes an example modulator manager 602, an example signal analyzer 604, and an example resonance determiner 606. In examples disclosed herein, any of the modulator manager 602, the signal analyzer 604, and/or the resonance determiner 606 may communicate via any suitable method of wired and/or wireless communication to respective devices internal to the controller 302 and/or external to the controller 302.

In the example of FIG. 6, the modulator manager 602 is a device that controls or is configured to control the modulation and frequency of operation of various oscillators in the sensor interrogator 102. For example, the controller 302 controls the frequency of operation of the VCO 304 of FIG. 3. Additionally, the modulation manager 602 controls the amplitude of the signal generated by the modulation oscillator 306 of FIG. 3. Furthermore, the modulator manager 602 queries, or is configured to query, one or more of the first acoustic resonant sensor 320, the second acoustic resonant sensor 322, or the third acoustic resonant sensor 324. For example, the modulator manager 602 generates and transmits a voltage corresponding to a desired frequency to set the frequency of operation of the VCO 304. The desired frequency to set the frequency of operation of the VCO 304 corresponds to a carrier frequency that will cause the group delay of one or more of the first acoustic resonant sensor 320, the second acoustic resonant sensor 322, or the third acoustic resonant sensor 324 to be in a linear region.

In the example illustrated in FIG. 6, the modulator manager 602 is additionally configured to adjust the frequency of operation of the VCO 304 by a value, Δf. The value to adjust the frequency of operation of the VCO 304 is defined based on the frequency of operation of the VCO 304 that will place the group delay of one or more of the first acoustic resonant sensor 320, the second acoustic resonant sensor 322, or the third acoustic resonant sensor 324 in another linear region. Moreover, the value to adjust the frequency of operation of the VCO 304 is based on the frequency span that corresponds to the limits of linear operation of one or more of the first acoustic resonant sensor 320, the second acoustic resonant sensor 322, or the third acoustic resonant sensor 324 between the upper and lower thresholds of the group delay in the linear region.

In the example of FIG. 6, the modulator manager 602 additionally determines the interrogation method used to query one or more of the first acoustic resonant sensor 320, the second acoustic resonant sensor 322, or the third acoustic resonant sensor 324. For example, in the first interrogation method, the modulator manager 602 transmits a first query signal whereas in a second interrogation method, the modulator manager 602 transmits a first query signal and a second query signal. In the second interrogation method, the modulator manager 602 causes the VCO 304 to operate at a first frequency for the first query signal and a second frequency for the second query signal. The first frequency and the second frequency corresponds to two frequencies that cause one or more of the first acoustic resonant sensor 320, the second acoustic resonant sensor 322, and the third acoustic resonant sensor 324 to have a first group delay and a second group delay where the first group delay and the second ground delay are substantially equivalent when one or more of the first acoustic resonant sensor 320, the second acoustic resonant sensor 322, and the third acoustic resonant sensor 324 are not measuring a value in an environment (e.g., pressure, temperature, etc.). For example, the first frequency and the second frequency are determined to find the group delay when calibrating the resonant sensor system 100.

In the illustrated example of FIG. 6, the signal analyzer 604 determines the group delay of one or more of the first acoustic resonant sensor 320, the second acoustic resonant sensor 322, or the third acoustic resonant sensor 324 based on the signal received from the TDC 318. The signal analyzer 604 additionally determines the polarity of the response to a query signal based on the signal received from the TDC 318. The polarity of the response to a query signal may be either negative or positive. A positive polarity (1) corresponds to a response to the query signal that is delayed with respect to the signal generated by the modulation oscillator 306 by the group delay of the acoustic resonant sensor being monitored. A negative polarity (−1) corresponds to a response to the query signal that is delayed with respect to the signal generated by the modulation oscillator 306 by 180° and the group delay.

In the illustrated example of FIG. 6, the signal analyzer 604 analyzes the group delay and determines whether the group delay is greater than or less than respective upper and lower threshold group delays. For example, the signal analyzer 604 may be calibrated with a range of group delays including an upper threshold $\phi_r^{max}$ corresponding to an upper value for a linear region of a resonators group delay distribution. Similarly, the signal analyzer 604 may be calibrated with a range of group delays including a lower threshold $\phi_r^{min}$ corresponding to a lower value for the linear region of the resonators group delay distribution.

In the example of FIG. 6, the resonance determiner 606 determines the resonance frequency of one or more of the first acoustic resonant sensor 320, the second acoustic resonant sensor 322, or the third acoustic resonant sensor 324. For example, the resonance determiner 606 determines whether the first interrogation method has been used to monitor one or more of the first acoustic resonant sensor 320, the second acoustic resonant sensor 322, or the third acoustic resonant sensor 324. If the first interrogation method has been used, the resonance determiner 606 determines the resonance frequency ($\omega_r$) of one or more of the first acoustic resonant sensor 320, the second acoustic resonant sensor 322, or the third acoustic resonant sensor 324 utilizing equation 2 and replacing the oscillation frequency with the carrier frequency ($\omega = \omega_c$) of the query signal. If the first interrogation method has not been used, the resonance determiner determines the difference in the group delay between the response to the first query signal and the response to the second query signal. The difference in the group delay, $\Delta\phi_r$, is defined by equations 11, 12, and 13 below:

$$\phi_{r \text{ and reflections, } 1} = \phi_{r,1} - a \qquad \text{Equation-11}$$

$$\phi_{r \text{ and reflections, } 2} = \phi_{r,2} - a \qquad \text{Equation-12}$$

$$\Delta\phi_r = \phi_{r \text{ and reflections, } 2} - \phi_{r \text{ and reflections, } 1} = \phi_{r,2} - \phi_{r,1} \qquad \text{Equation-13}$$

In the example of FIG. 6, as shown in equation 13, the use of two query signals eliminates the electromagnetic delay introduced by the reflections off of various surfaces in the environment that the resonant sensor system 100 is located in or near. During measurement of the resonance frequency of one or more of the first acoustic resonant sensor 320, the second acoustic resonant sensor 322, and the third acoustic resonant sensor 324, the group delay at the first frequency of the first query signal is not substantially equivalent to the group delay at the second frequency of the second query signal. The relationship between the group delay at the first frequency and the group delay at the second frequency is defined by equation 14 below and the group delay at the first frequency and the second frequency are shown by equations 15 and 16 below, respectively:

$$\phi_{r,0} = \frac{\phi_{r,2} + \phi_{r,1}}{2} \qquad \text{Equation-14}$$

$$\phi_{r,1} = \phi_{r,0} - \frac{\Delta\phi_r}{2} \qquad \text{Equation-15}$$

$$\phi_{r,2} = \phi_{r,0} + \frac{\Delta\phi_r}{2} \qquad \text{Equation-16}$$

In the example of FIG. 6, in equations 14, 15, and 16, $\phi_{r,0}$ represents the calibration group delay determined for the first frequency and the second frequency. The resonance frequency of one or more of the first acoustic resonant sensor 320, the second acoustic resonant sensor 322, or the third acoustic resonant sensor 324 can be modelled for each of the first and second frequencies based on equations 15 and 16. The models for the resonance frequency of one or more of the first acoustic resonant sensor 320, the second acoustic resonant sensor 322, or the third acoustic resonant sensor 324 are shown in equations 17 and 18 below:

$$f_r = m(\phi_{r,1} - \phi_{r,0}) + f_{r,0} \qquad \text{Equation-17}$$

$$f_r = -m(\phi_{r,2} - \phi_{r,0}) + f_{r,0} \qquad \text{Equation-18}$$

In the example of FIG. 6, in equations 17 and 18, the term $f_{r,0}$ represents the resonance frequency of one or more of the first acoustic resonant sensor 320, the second acoustic resonant sensor 322, or the third acoustic resonant sensor 324 when the group delay measured at the first frequency ($\phi_{r,1}$) and the group delay measured at the second frequency ($\phi_{r,2}$) are the same ($\phi_{r,1} = \phi_{r,2} = \phi_{r,0}$) (e.g., at calibration). In equations 17 and 18, the term m represents the slope (e.g., derivative) of resonance frequency over group delay in the linear region of one or more of the first acoustic resonant sensor 320, the second acoustic resonant sensor 322, or the third acoustic resonant sensor 324 when queried at the first frequency and the second frequency. The value of the term m can be determined at calibration and depends on the quality factor (Q) of the resonant sensor as well as the carrier frequency. This dependency can be determined analytically via a manipulation of equation 2 under the assumption that $$\frac{c_N}{c_o} \sim 0 \text{ and } \frac{\omega}{\omega_r Q} \gg \left(\left(\frac{\omega}{\omega_r}\right)^2 - 1\right).$$

Thus, the resulting equation includes (a) a variable term that depends on group delay and dominates the equation (e.g., equation 19) when the carrier frequency is near resonance (e.g. $\omega \sim \omega_r$) and (b) a constant term that is independent of group delay and sets m when the resonant sensor operates in the linear region.

$$\frac{\partial \omega_r}{\partial \phi_r} = \frac{\omega^2}{2Q} + \frac{\phi}{\sqrt{\phi^2 - \left(\frac{2Q}{\omega}\right)^2}} \frac{\omega^2}{2Q} \quad \text{Equation 19}$$

$$m = \frac{1}{2\pi} \frac{\omega^2}{2Q} \quad \text{Equation 20}$$

In the example of FIG. 6, by solving equation 17 and/or equation 18, the resonance determiner 606 computes the resonance frequency and the slope m that relates to the quality factor (Q) of one or more of the first acoustic resonant sensor 320, the second acoustic resonant sensor 322, or the third acoustic resonant sensor 324 based on the respective group delays associated with the first frequency and the second frequency. After determining the resonance frequency of one or more of the first acoustic resonant sensor 320, the second acoustic resonant sensor 322, or the third acoustic resonant sensor 324, the resonance determiner 606 transmits the resonance frequency of one or more of the first acoustic resonant sensor 320, the second acoustic resonant sensor 322, or the third acoustic resonant sensor 324 to the computing system 110.

FIG. 7 is a graphical illustration 700 of a non-linear distribution of the group delay of the first resonant sensor 104 (line 702) of FIGS. 1, 3, and 4 when the first resonant sensor 104 is queried at a fixed carrier frequency ($f_c$). The graphical illustration 700 illustrates the polarity of a response to a query signal. The portion of the response to the query signal including group delays associated with a resonance frequency that is less than the resonance frequency that is associated with the peak group delay are categorized as negative polarity. Negative polarity (−1) also corresponds to a response to the query signal that is delayed with respect to the signal generated by the modulation oscillator 306 by 180° and the group delay.

In the illustrated example of FIG. 7, the portion of the response to the query signal including group delays associated with a resonance frequency that is greater than the resonance frequency that is associated with the peak group delay are categorized as positive polarity. Positive polarity (1) also corresponds to a response to the query signal that is delayed with respect to the signal generated by the modulation oscillator 306 by the group delay of the acoustic resonant sensor being monitored.

Figure 8:
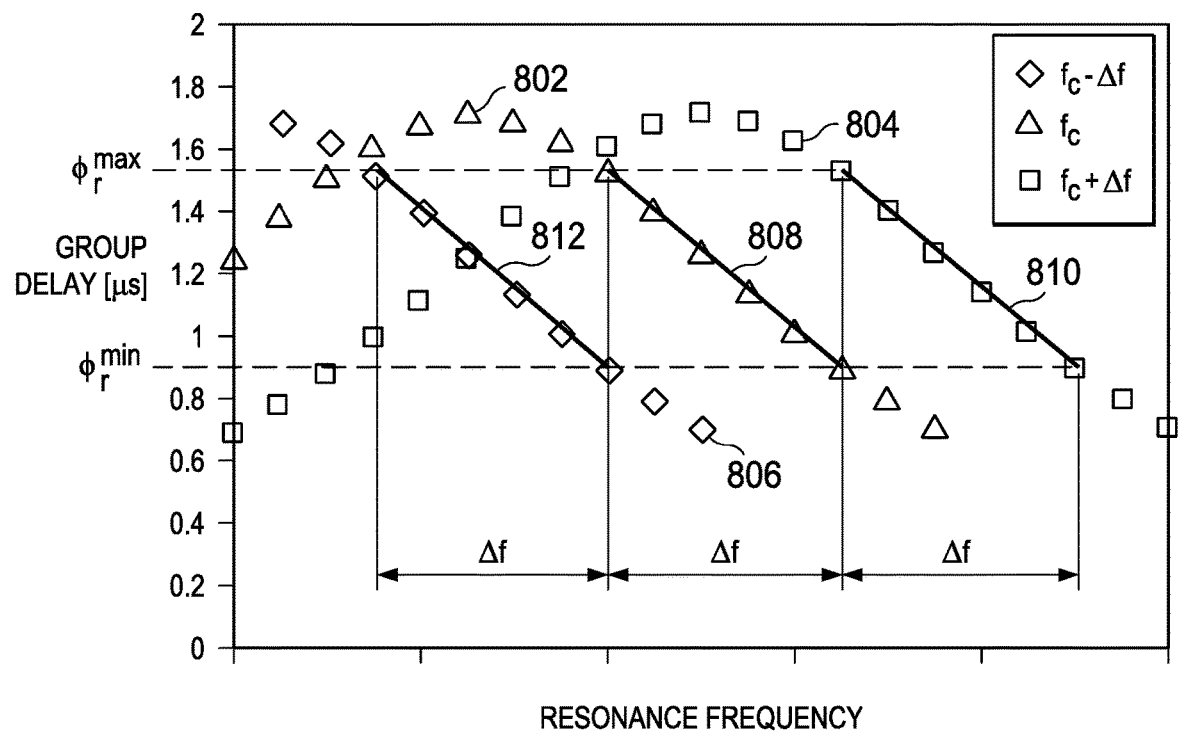
FIG. 8 is a graphical illustration of a first non-linear distribution of the group delay of the first resonant sensor, a second non-linear distribution of the group delay of the first resonant sensor, and a third non-linear distribution of the group delay of the first resonant sensor of FIGS. 1, 3, and 4.

FIG. 8 is a graphical illustration 800 of a first non-linear distribution of the group delay of the first resonant sensor 104 (line 802), a second non-linear distribution of the group delay of the first resonant sensor 104 (line 804), and a third non-linear distribution of the group delay of the first resonant sensor 104 (line 806) of FIGS. 1, 3, and 4. The graphical illustration 800 includes a group delay axis measured in μs and a resonance frequency axis.

In the example of FIG. 8, the first non-linear distribution of the group delay of the first resonant sensor 104 (line 802) corresponds to a query signal at a first carrier frequency, $f_c$. In the example of FIG. 8, the first frequency corresponds to a carrier frequency of 2.5002 GHz. When queried at the first carrier frequency, the first non-linear distribution of the group delay of the first resonant sensor 104 (line 802) includes a first linear region 808. The first linear region 808 is bounded on the group delay axis by the values $\phi_r^{max}$ and the $\phi_r^{min}$. The value $\phi_r^{max}$ is an upper threshold corresponding to an upper value for a linear region of the group delay distribution of the first resonant sensor 104. In the example of FIG. 8, the term $\phi_r^{max}$ corresponds to a group delay of 1.55 μs. The term $\phi_r^{min}$ is a lower threshold corresponding to a lower value for the linear region of the group delay distribution of the first resonant sensor 104. In the example of FIG. 8, the $\phi_r^{min}$ corresponds to a group delay of 0.9 μs. The first linear region 808 is bounded on the resonance frequency axis by a frequency range, Δf, of 0.45 MHz.

In the example of FIG. 8, the second non-linear distribution of the group delay of the first resonant sensor 104 (line 804) corresponds to a query signal at a second carrier frequency, $f_c+\Delta f$. In the example of FIG. 8, the second carrier frequency corresponds to a frequency of 2.50065 GHz. When queried at the second carrier frequency, the second non-linear distribution of the group delay of the first resonant sensor 104 (line 804) includes a second linear region 810. The second linear region 810 is bounded on the group delay axis by the values $\phi_r^{max}$ and the $\phi_r^{min}$ and on the resonance frequency axis by the frequency range, Δf, of 0.45 MHz. The third non-linear distribution of the group delay of the first resonant sensor 104 (line 806) corresponds to a query signal at a third carrier frequency, $f_c-\Delta f$. In the example of FIG. 8, the third carrier frequency corresponds to a frequency of 2.49975 GHz. When queried at the third carrier frequency, the third non-linear distribution of the group delay of the first resonant sensor 104 (line 806) includes a third linear region 812. The third linear region 812 is bounded on the group delay axis by the values $\phi_r^{max}$ and the $\phi_r^{min}$ and on the resonance frequency axis by the frequency range, Δf, of 0.45 MHz.

In the illustrated example of FIG. 8, when the first resonant sensor 104 is queried at the first carrier frequency, the signal analyzer 604 of FIG. 6 determines the group delay of the first resonant sensor 104 based on the output of the TDC 318. If signal analyzer 604 determines that the group delay of the first resonant sensor 104, $\phi_r$, is less than $\phi_r^{min}$ or greater than $\phi_r^{max}$, the modulator manager 602 adjusts the frequency of VCO 304 by the frequency range Δf. If the group delay of the first resonant sensor 104 is greater than $\phi_r^{max}$, the modulator manager 602 decreases the frequency by Δf. If the group delay of the first resonant sensor 104 is less than $\phi_r^{min}$, the modulator manager 602 increases the frequency by Δf. This adjustment of the frequency of the VCO 304 allows the signal analyzer 604 to measure the group delay of the first resonant sensor 104 via the TDC 318 and whether the resonance frequency of the first resonant sensor 104 is in a linear region of operation.

Figure 9:
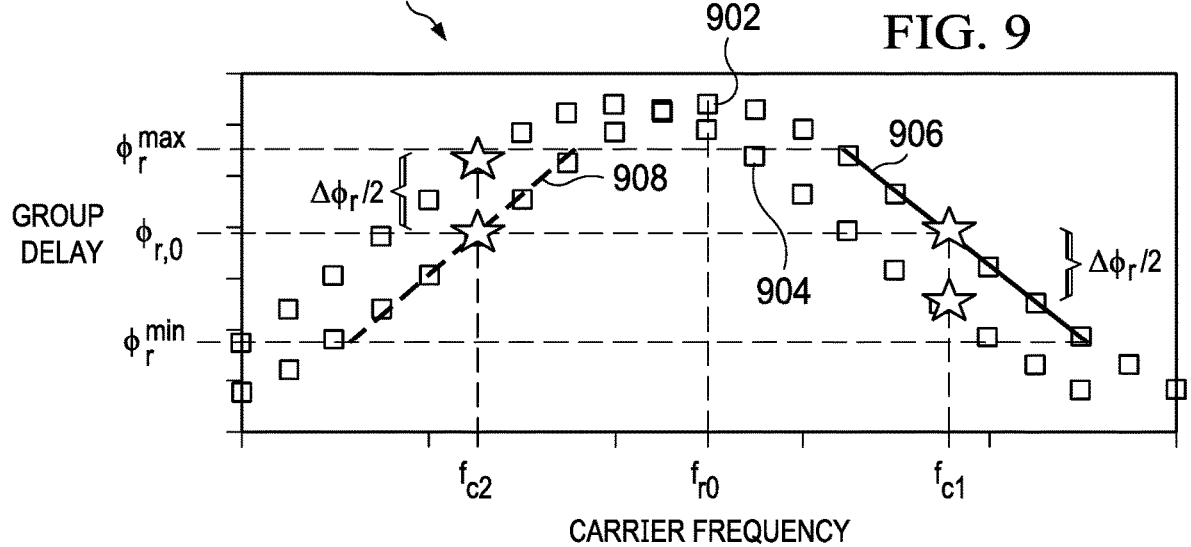
FIG. 9 is a graphical illustration of a first non-linear distribution of the group delay of the first resonant sensor when the first resonant sensor is not measuring a physical quantity and a second non-linear distribution of the group delay of the first resonant sensor when the first resonant sensor is measuring a physical quantity utilizing a second interrogation method.

FIG. 9 is a graphical illustration 900 of a first non-linear distribution of the group delay of the first resonant sensor 104 when the first resonant sensor 104 is not measuring a physical quantity (line 902) and a second non-linear distribution of the group delay of the first resonant sensor 104 when the first resonant sensor 104 is measuring a physical quantity (line 904) when utilizing the second interrogation method. The graphical illustration 900 additionally includes a first linear region 906, and a second linear region 908.

In the example of FIG. 9, the first linear region 906 represents a positive polarity linear region associated with the first non-linear distribution of the group delay when the first resonant sensor 104 is not measuring a physical quantity (line 902) and is queried with a first query signal. The second linear region 908 represents a negative polarity linear region associated with the first non-linear distribution of the group delay when the first resonant sensor 104 is not measuring a physical quantity (line 904) and is queried with a second query signal. The graphical illustration 900 includes a group delay axis and a carrier frequency axis.

In the example of FIG. 9, the first linear region 906 of the first non-linear distribution of the group delay when the first resonant sensor 104 is not measuring a physical quantity (line 902) corresponds to a first query signal at a first carrier frequency, $f_{c1}$. The second linear region 908 of the first non-linear distribution of the group delay when the first resonant sensor 104 is not measuring a physical quantity (line 902) corresponds to a second query signal at a second carrier frequency, $f_{c2}$. Both the first linear region 906 and the second linear region 908 are bounded on the group delay axis by the values $\phi_r^{max}$ and the $\phi_r^{min}$.

In the example of FIG. 9, the first carrier frequency, $f_{c1}$, and the second carrier frequency, $f_{c2}$, correspond to frequencies that cause the same or substantially equivalent group delay ($\phi_{r,0}$) in the first resonant sensor 104 when the first resonant sensor 104 is not measuring a physical quantity. The value of the calibration group delay, $\phi_{r,0}$, and the calibration resonance frequency, $f_{r,0}$, can be determined during calibration when the first resonant sensor 104 is not measuring a physical quantity. When the first resonant sensor 104 is exposed to a physical quantity (e.g., temperature, humidity, pressure, and torque) the non-linear distribution of the group delay with respect to carrier frequency will shift to a new frequency range. This new non-linear distribution is the second non-linear distribution of the group delay of the first resonant sensor 104 when the first resonant sensor 104 is measuring a physical quantity (line 904). When queried at the first carrier frequency, $f_{c1}$, and the second carrier frequency, $f_{c2}$, the group delay is not the same or substantially equivalent.

In the example of FIG. 9, after querying the first resonant sensor 104 at the first frequency, and the second frequency, the signal analyzer 604 of FIG. 6 determines a first group delay ($\phi_{r\ and\ reflections,\ 1}$) associated with the first query signal at the first carrier frequency, $f_{c1}$, and a second group delay ($\phi_{r\ and\ reflections,\ 2}$) associated with the second query signal at the second carrier frequency, $f_{c2}$. The first group delay ($\phi_{r\ and\ reflections,\ 1}$) and the second group delay ($\phi_{r\ and\ reflections,\ 2}$) include electromagnetic delays as a result of multiple paths of reflection for responses to query signals when using the second interrogation method. To remove these additional delays, the signal analyzer 604 of FIG. 6 computes the difference between the first group delay ($\phi_{r\ and\ reflections,\ 1}$) and the second group delay ($\phi_{r\ and\ reflections,\ 2}$) utilizing equation 13. Having previously stored the calibration group delay ($\phi_{r,0}$), the signal analyzer 604 of FIG. 6 determines the group delay of the first resonant sensor 104 at the first carrier frequency utilizing equation 15. Similarly, the signal analyzer 604 of FIG. 6 determines the group delay of the first resonant sensor 104 at the second carrier frequency utilizing equation 16.

FIG. 10 is a graphical illustration 1000 showing an intersection of the first linear region 906 and the second linear region 908 of FIG. 9 intersecting at the calibration resonance frequency, $f_{r,0}$. The graphical illustration 1000 includes a group delay axis and a resonance frequency axis. In the example of FIG. 6, after the modulator manager 602 queries the first resonant sensor 104 at the first carrier frequency, $f_{c1}$, and the second carrier frequency, $f_{c2}$, and the signal analyzer 604 determines the group delay of the first resonant sensor 104 at the first carrier frequency and the group delay of the first resonant sensor 104 at the second carrier frequency utilizing equation 15 and 16, respectively, the resonance determiner 606 computes the resonance frequency of the first resonant sensor 104 by solving equation 17 and equation 18.

In the example of FIG. 10, the slope m of the first linear region 906 and the second linear region 908 is dependent on the quality factor (Q) and may change. For example, if the resonant sensor system 100 is monitoring pressure with the first resonant sensor 104 and the temperature of the environment changes, the slope of the first linear region 906 and the second linear region 908 may change. In addition to measuring the resonance frequency, the resonant sensor system 100 additionally determines variations in the quality factor (Q) of one or more resonant sensors. To determines variations in the quality factor (Q), the term m is first determined by solving equations 17 and 18 as a system of equations and then utilizing equation 20 to determine the quality factor (Q) of the resonant sensor as a function of the slope, m, and the carrier frequency, $f_c$, utilized to query the resonant sensor.

FIG. 11 is a graphical illustration 1100 of a first extended linear region (line 1102) and a second extended linear region (line 1104). The graphical illustration 1100 includes a group delay axis and a resonance frequency axis. The first extended linear region (line 1102) corresponds to a positive polarity region of linearity for the first resonant sensor 104. The second extended linear region (line 1104) corresponds to a negative polarity region of linearity for the first resonant sensor 104. The first extended linear region (line 1102) includes the first linear region 808 corresponding to the linear region of the first non-linear distribution of the group delay of the first resonant sensor 104 (line 802) of FIG. 8. The first extended linear region (line 1102) includes the second linear region 810 corresponding to the linear region of the second non-linear distribution of the group delay of the first resonant sensor 104 (line 804) of FIG. 8. The first extended linear region (line 1102) includes the third linear region 812 corresponding to the linear region of the third non-linear distribution of the group delay of the first resonant sensor 104 (line 806) of FIG. 8. The first extended linear region (line 1102) and the second extended linear region (line 1104) allows the signal analyzer 604 and the resonance determiner 606 to process responses to query signals and determine the resonance frequency of the first resonant sensor 104 after determining the polarity and the absolute value of the group delays associated with the first resonant sensor 104 based on the signal received from the TDC 318.

Figure 12:
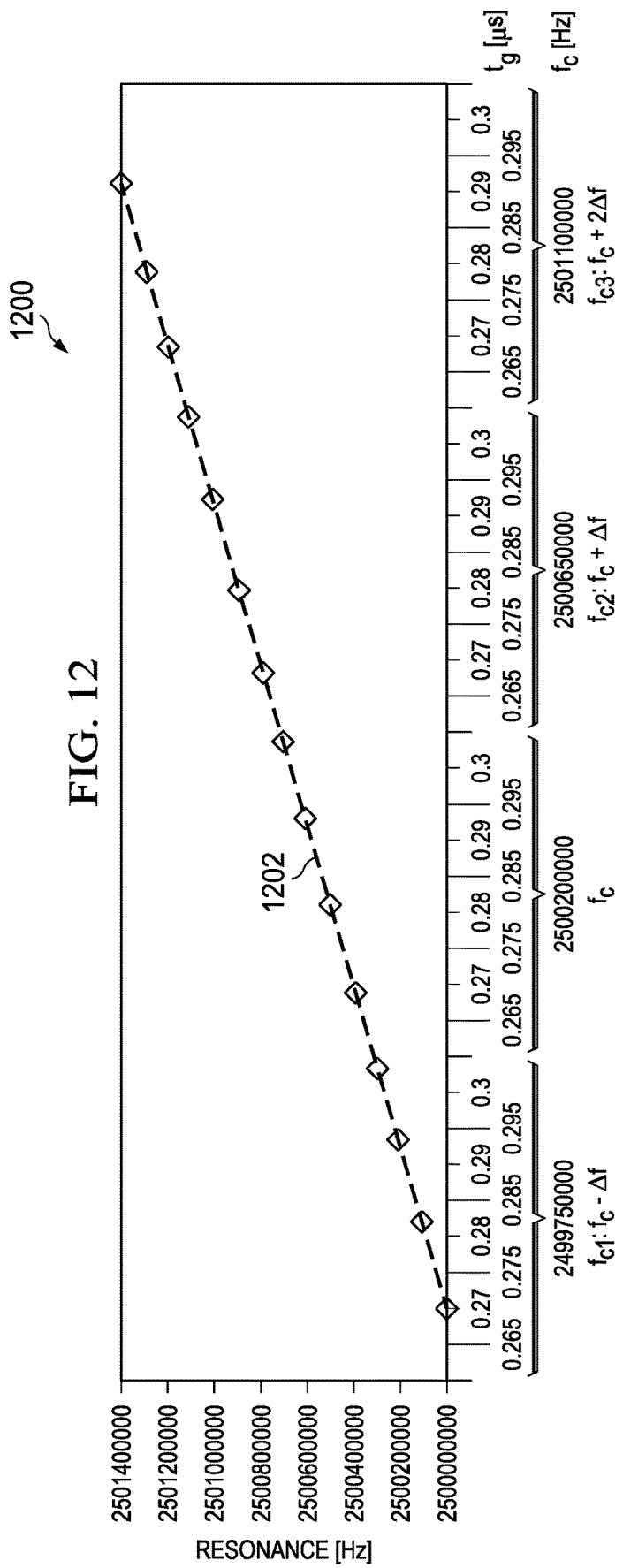
FIG. 12 is a graphical illustration showing an extended linear region including positive polarity that is associated with the first resonant sensor 104 of FIGS. 1, 3, and 4.

FIG. 12 is a graphical illustration 1200 illustrating an extended linear region (line 1202) including positive polarity that is associated with the first resonant sensor 104 of FIGS. 1, 3, and 4. The graphical illustration 1200 includes a group delay axis measured in us and a resonance frequency axis measured in Hz. The group delay axis ranges from 0.265 μs to 0.3 μs. The resonance frequency axis ranges from 2,500,000,000 Hz to 2,501,400,000 Hz. The extended linear region (line 1202) includes a first linear region corresponding to a non-linear distribution of the group delay of the first resonant sensor 104 when measured at a first frequency $f_c$, a second linear region corresponding to a non-linear distribution of the group delay of the first resonant sensor 104 when measured at a second frequency $f_{c1}$, a third linear region corresponding to a non-linear distribution of the group delay of the first resonant sensor 104 when measured at a third frequency $f_{c2}$, and a fourth linear region corresponding to a non-linear distribution of the group delay of the first resonant sensor 104 when measured at a fourth frequency $f_{c3}$.

In the example of FIG. 12, the second frequency $f_{c1}$ is equal to the first frequency $f_c$ minus Δf. The third frequency $f_{c2}$ is equal to the first frequency $f_c$ plus Δf. The fourth frequency $f_{c3}$ is equal to the first frequency $f_c$ plus 2Δf. In the example of FIG. 12, the first frequency, $f_c$, is equal to 2,500,200,000 Hz, the second frequency $f_{c1}$ is equal to 2,499,750,000 Hz, the third frequency $f_{c2}$ is equal to 2,500,650,000 Hz, and the fourth frequency $f_{c3}$ is equal to 2,501,100,000 Hz. In the example of FIG. 12, Δf is equal to 0.45 MHz. In FIG. 12, the upper threshold for the group delay, $\phi_r^{max}$ is equal to 0.3 μs and the lower threshold for the group delay, $\phi_r^{min}$ is equal to 0.265 μs. In the example of FIG. 12, the resonance frequency of the first resonant sensor 104 is 2.5 GHz and the quality factor of the first resonant sensor 104 is 2000. In the example of FIG. 12, the frequency of operation of the modulation oscillator 306 is 0.25 MHz. Under the conditions stated in FIG. 12, the resonant sensor system 100 has a sensitivity of 9 kHz/ns and an R-squared error of 0.9998. Assuming that the TDC 318 includes a detection period equivalent to about 50 picoseconds, the resonant sensor system 100 can detect a 450 parts-per-billion shift in resonance frequency.

While an example manner of implementing the controller 302 of FIG. 3 is illustrated in FIG. 6, one or more of the elements, processes and/or devices illustrated in FIG. 6 may be combined, divided, re-arranged, omitted, eliminated and/or implemented in any other way. Further, the example modulator manager 602, the example signal analyzer 604, the example resonance determiner 606 and/or, more generally, the example controller 302 of FIG. 6 may be implemented by hardware, software, firmware and/or any combination of hardware, software and/or firmware. Thus, for example, any of the example modulator manager 602, the example signal analyzer 604, the example resonance determiner 606 and/or, more generally, the example controller 302 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example modulator manager 602, the example signal analyzer 604, the example resonance determiner 606 and/or, more generally, the example controller 302 is/are hereby expressly defined to include a non-transitory computer readable storage device or storage disk such as a memory, a digital versatile disk (DVD), a compact disk (CD), a Blu-ray disk, etc. including the software and/or firmware. Further still, the example controller 302 of FIGS. 3, 4, and 6 may include one or more elements, processes and/or devices in addition to, or instead of, those illustrated in FIG. 6, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 13:
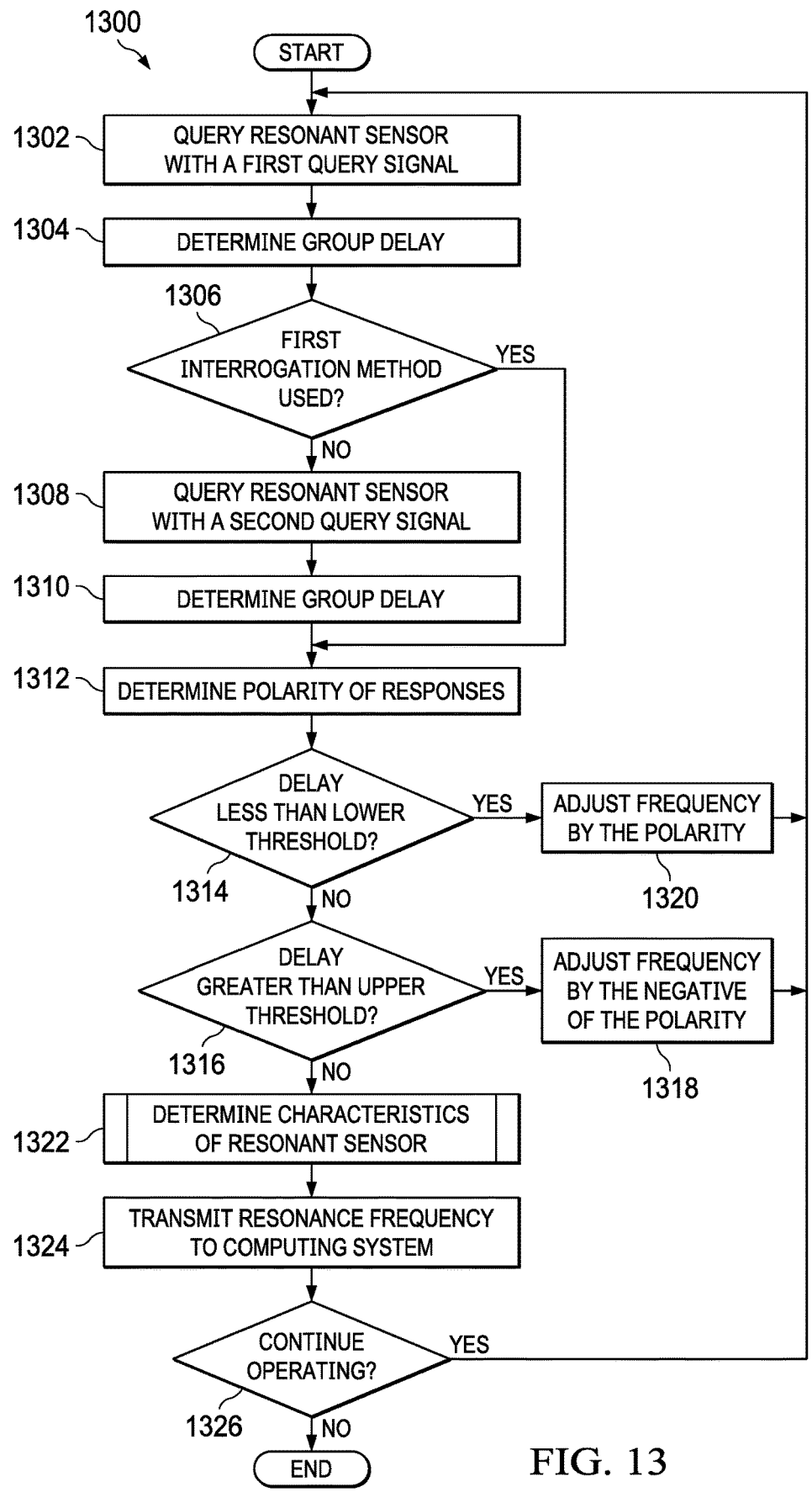
FIG. 13 is a flowchart representative of a process that may be implemented using logic or machine readable instructions that may be executed to implement the controller of FIGS. 3, 4, and 6.
Figure 14:
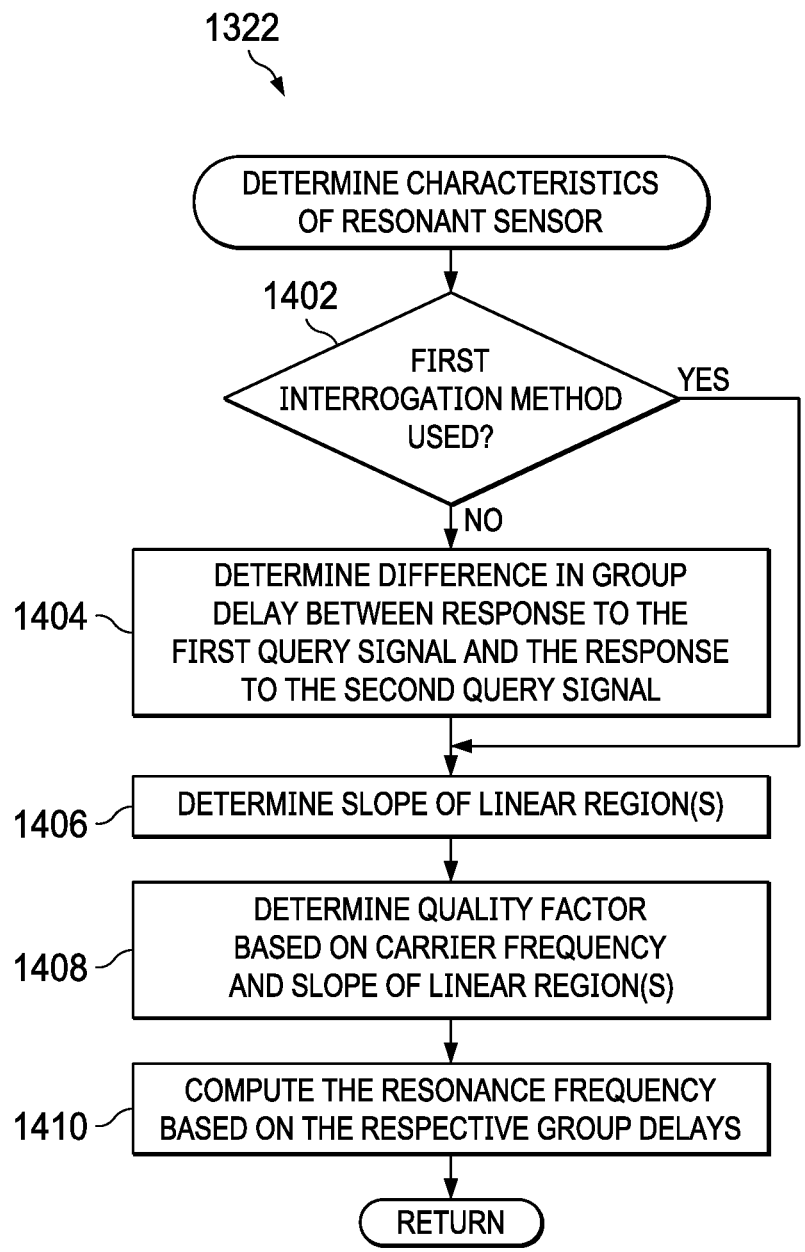
FIG. 14 is a flowchart representative of a process that may be implemented using logic or machine readable instructions to execute a sub-routine of the process of FIG. 13.

A flowchart representative of example hardware logic, machine readable instructions, hardware implemented state machines, and/or any combination thereof for implementing the controller 302 of FIG. 6 is shown in FIGS. 13 and 14. The machine readable instructions may be one or more executable programs or portion(s) of an executable program for execution by a computer processor such as the processor 1512 shown in the example processor platform 1500 discussed below in connection with FIG. 15. The program may be embodied in software stored on a non-transitory computer readable storage medium such as a CD-ROM, a floppy disk, a hard drive, a DVD, a Blu-ray disk, or a memory associated with the processor 1512, but the entire program and/or parts thereof could alternatively be executed by a device other than the processor 1512 and/or embodied in firmware or dedicated hardware. Further, although the example program is described with reference to the flowchart illustrated in FIGS. 13 and 14, many other methods of implementing the example controller 302 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

The machine readable instructions described herein may be stored in one or more of a compressed format, an encrypted format, a fragmented format, a packaged format, etc. Machine readable instructions as described herein may be stored as data (e.g., portions of instructions, code, representations of code, etc.) that may be utilized to create, manufacture, and/or produce machine executable instructions. For example, the machine readable instructions may be fragmented and stored on one or more storage devices and/or computing devices (e.g., servers). The machine readable instructions may require one or more of installation, modification, adaptation, updating, combining, supplementing, configuring, decryption, decompression, unpacking, distribution, reassignment, etc. in order to make them directly readable and/or executable by a computing device and/or other machine. For example, the machine readable instructions may be stored in multiple parts, which are individually compressed, encrypted, and stored on separate computing devices, wherein the parts when decrypted, decompressed, and combined form a set of executable instructions that implement a program such as that described herein. In another example, the machine readable instructions may be stored in a state in which they may be read by a computer, but require addition of a library (e.g., a dynamic link library (DLL)), a software development kit (SDK), an application programming interface (API), etc. in order to execute the instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, the disclosed machine readable instructions and/or corresponding program(s) are intended to encompass such machine readable instructions and/or program(s) regardless of the particular format or state of the machine readable instructions and/or program(s) when stored or otherwise at rest or in transit.

As mentioned above, the example processes of FIGS. 13 and 14 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

FIG. 13 is a flowchart representative of process 1300 that may be implemented using logic or machine readable instructions that may be executed to implement the controller 302 of FIGS. 3, 4, and 6. The process 1300 begins at block 1302 where the modulator manage 602 queries a resonant sensors (e.g., the first resonant sensor 104, the second resonant sensor 106, the nth resonant sensor 108, etc.) with a first query signal. For example, the query signal may correspond to an amplitude modulated signal that is generated as a result of the modulator manager 602 generating and transmitting a signal to the VCO 304 corresponding to a frequency to which the frequency of operation of the VCO 304 is to be set.

In the example of FIG. 13, the process 1300 continues at block 1304 where the signal analyzer 604 determines the group delay associated the response of a queried resonant sensor. For example, the signal analyzer 604 determines the group delay of the queried resonant sensor based on the output of the TDC 318. At block 1306, the modulation manager 602 determines whether a first interrogation method has been used. For example, a first interrogation method corresponds to a wired interrogation method. If the modulation manager 602 determines that the first interrogation method has been used (block 1306: YES), the process 1300 proceeds to block 1312. If the modulation manager 602 determines that the first interrogation method has not been used (block 1306: NO), the process 1300 proceeds to block 1308 where the modulation manager 602 queries the previously queried resonant sensor with a second query signal. For example, the modulation manager 602 may query the resonant sensor with a second signal at a second frequency different than a first frequency of the first query signal.

In the example of FIG. 13, the process 1300 continues at block 1310 where the signal analyzer 604 determines the group delay associated with the response to the second query signal. At block 1312, the signal analyzer 604 determines the polarity of the responses to the first and/or second query signals. For example, the signal analyzer 604 determines the polarity of the responses to the first and/or second query signals based on the output of the TDC 318. At block 1314, the signal analyzer 604 determines whether the group delay (s) associated with the queried resonant sensor is less than a lower threshold. For example, the lower threshold may correspond to a lower limit of a linear region of the group delay associated with the queried resonant sensor. If the signal analyzer 604 determines that the group delay is less than the lower threshold (block 1314: YES), the process 1300 proceeds to block 1320. If the signal analyzer 604 determines that the group delay is not less than the lower threshold (block 1314: NO), the process 1300 proceeds to block 1316.

In the example illustrated in FIG. 13, at block 1316, the signal analyzer 604 determines whether the group delay(s) associated with the queried resonant sensor is greater than an upper threshold. For example, the upper threshold may correspond to an upper limit of a linear region of the group delay associated with the queried resonant sensor. If the signal analyzer 604 determines that the group delay is greater than the upper threshold (block 1316: YES), the process 1300 proceeds to block 1318. If the signal analyzer 604 determines that the group delay is not greater than the upper threshold (block 1316: NO), the process 1300 proceeds to block 1322. At block 1318, in response to the signal analyzer 604 determining that the group delay is greater than the upper threshold, the modulator manager 602 adjusts the frequency of operation of the VCO 304 by the negative of the polarity (e.g., the inverse of the polarity). For example, if the polarity is negative, the modulator manager 602 adjusts the frequency of operation, $f_c$, of the VCO 304 to be $f_c + \Delta f$. After block 1318, the process 1300 proceeds to block 1302.

In the illustrated example of FIG. 13, at block 1320, in response to the signal analyzer 604 determining that the group delay is less than the lower threshold, the modulator manager 602 adjusts the frequency of operation of the VCO 304 by the polarity. For example, if the polarity is negative, the modulator manager 602 adjusts the frequency of operation, $f_c$, of the VCO 304 to be $f_c-\Delta f$. After block 1320, the process 1300 proceeds to block 1302.

In the example of FIG. 13, at block 1322, the resonance determiner 606 determines characteristics of the resonant sensor of the queried resonant sensor. At block 1324, the resonance determiner 606 transmits the resonance frequency to a computing system (e.g., the computing system 110). At block 1326, the resonance determiner 606 determines whether to continue operating. For example, a condition that may cause the resonance determiner 606 to determine not to continue operating may be a disconnection from power. For example, a condition that may cause the resonance determiner 606 to determine to continue operating may be an instruction from the computing system 110 to monitor one or more resonant sensors. If the resonance determiner 606 determines to continue operating (block 1326: YES), the process 1300 proceeds to block 1302. If the resonance determiner 606 determines not to continue operating (block 1326: NO), the process 1300 ends.

FIG. 14 is a flowchart representative of a process that may be implemented using logic or machine readable instructions to execute a sub-routine of block 1322 of the process 1300 of FIG. 13. At block 1402 of the sub-routine of block 1322, the resonance determiner 606 determines whether a first interrogation method was used to interrogate a resonant sensor. For example, a first interrogation method corresponds to a wired interrogation method. If the resonance determiner 606 determines that the first interrogation method has been used (block 1402: YES), the sub-routine of block 1322 proceeds to block 1406. If the resonance determiner 606 determines that the first interrogation method has not been used (block 1402: NO), the sub-routine of block 1322 proceed to block 1404.

In the example of FIG. 14, at block 1404, the resonance determiner 606 determines the difference in the group delay between the response to the first query signal and the response to the second query signal. For example, the resonance determiner 606 may determine the difference in the group delay between the response to the first query signal and the response to the second query signal based on equation 11. At block 1406, the resonance determiner 606 utilizes one or more of equations 19 and 20 to determines the slope of the linear region(s) of the queried resonant sensor. At block 1408, the resonance determiner 606 additionally determines the quality factor (Q) of the queried resonant sensor based on carrier frequency and slope of the linear region(s). For example, the resonance determiner 606 determines the quality factor (Q) of the queried resonant sensor by a manipulation of equation 20.

In the illustrated example of FIG. 14, at block 1410, the resonance determiner 606 computes the resonance frequency of the queried resonant sensor based on the respective group delays. For example, if the first interrogation method is used, the resonance determiner 606 computes the resonance frequency of the queried resonant sensor based on the respective group delays based on equation 3. For example, if the first interrogation method is not used, the resonance determiner 606 computes the resonance frequency of the queried resonant sensor based on the respective group delays based on equations 12-16. After block 1410, the sub-routine of block 1322 returns to the process 1300 at block 1324.

Figure 15:
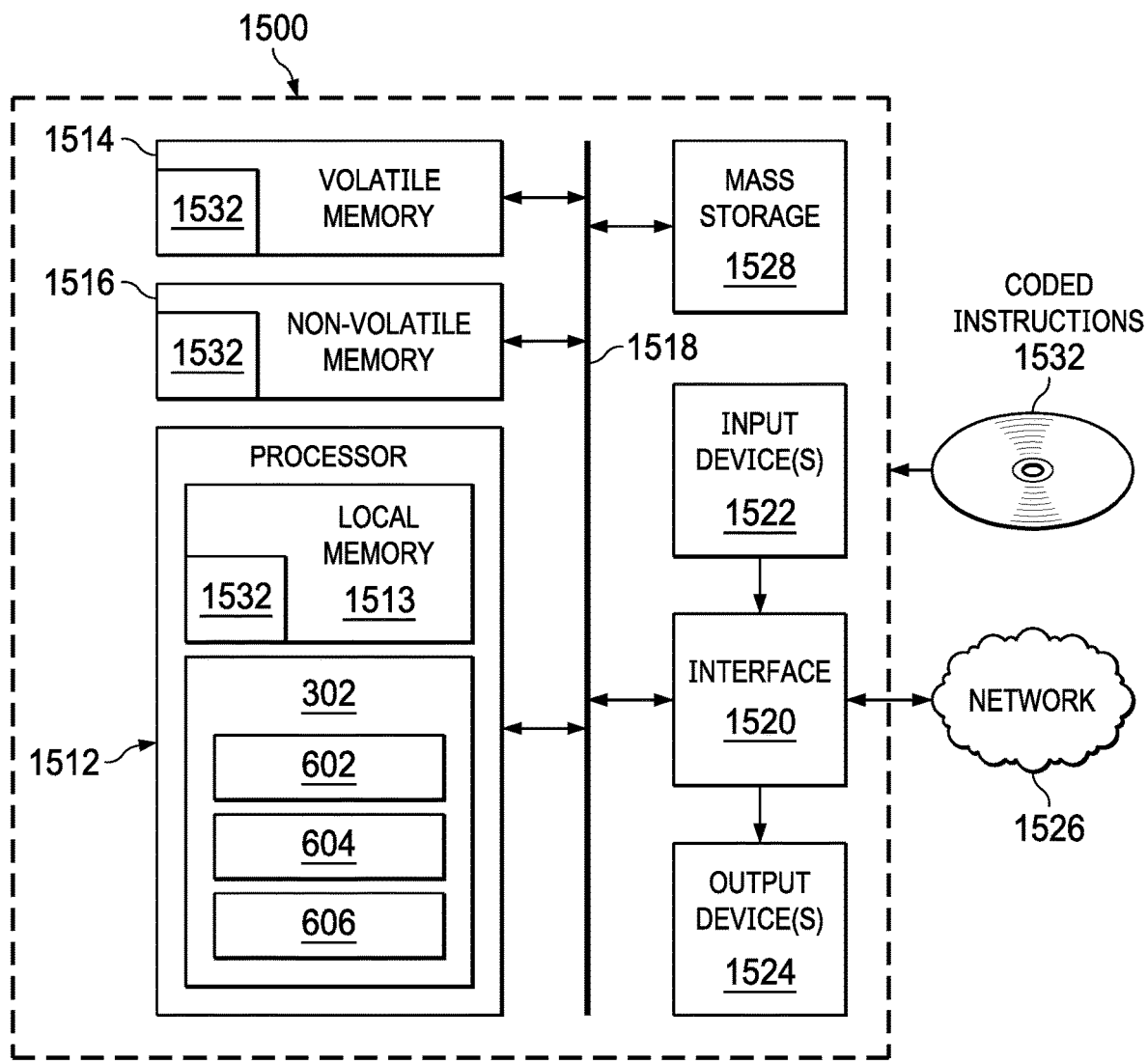
FIG. 15 is a block diagram of an example processing platform structured to execute the instructions of FIGS. 13 and 14 to implement the controller of FIGS. 3, 4, and 6.

FIG. 15 is a block diagram of an example processor platform 1500 structured to execute the instructions of FIGS. 13 and 14 to implement the controller 302 of FIGS. 3, 4, and 6. The processor platform 1500 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset or other wearable device, or any other type of computing device.

The processor platform 1500 of the illustrated example includes a processor 1512. The processor 1512 of the illustrated example is hardware. For example, the processor 1512 can be implemented by one or more integrated circuits, logic circuits, microprocessors, GPUs, DSPs, or controllers from any desired family or manufacturer. The hardware processor may be a semiconductor based (e.g., silicon based) device. In this example, the processor implements the example modulator manager 602, the example signal analyzer 604, and the example resonance determiner 606.

The processor 1512 of the illustrated example includes a local memory 1513 (e.g., a cache). The processor 1512 of the illustrated example is in communication with a main memory including a volatile memory 1514 and a non-volatile memory 1516 via a bus 1518. The volatile memory 1514 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 1516 may be implemented by flash memory and/or any other desired type of memory device. Access to the main memory 1514, 1516 is controlled by a memory controller.

The processor platform 1500 of the illustrated example also includes an interface circuit 1520. The interface circuit 1520 may be implemented by any type of interface standard, such as an Ethernet interface, a universal serial bus (USB), a Bluetooth® interface, a near field communication (NFC) interface, and/or a PCI express interface.

In the illustrated example, one or more input devices 1522 are connected to the interface circuit 1520. The input device(s) 1522 permit(s) a user to enter data and/or commands into the processor 1512. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 1524 are also connected to the interface circuit 1520 of the illustrated example. The output devices 1524 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 1520 of the illustrated example, thus, typically includes a graphics driver card, a graphics driver chip and/or a graphics driver processor.

The interface circuit 1520 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 1526. The communication can be via, for example, an Ethernet connection, a digital subscriber line (DSL) connection, a telephone line connection, a coaxial cable system, a satellite system, a line-of-site wireless system, a cellular telephone system, etc.

The processor platform 1500 of the illustrated example also includes one or more mass storage devices 1528 for storing software and/or data. Examples of such mass storage devices 1528 include floppy disk drives, hard drive disks, compact disk drives, Blu-ray disk drives, redundant array of independent disks (RAID) systems, and digital versatile disk (DVD) drives.

The machine executable instructions 1532 of FIGS. 13 and 14 may be stored in the mass storage device 1528, in the volatile memory 1514, in the non-volatile memory 1516, and/or on a removable non-transitory computer readable storage medium such as a CD or DVD.

From the foregoing, it will be appreciated that example methods, apparatus and articles of manufacture have been disclosed that provide a resonant sensor system that detects resonance frequencies of resonant sensors based on changes in group delays associated with the resonant sensors. Because the examples disclosed herein utilize the group delay of resonant sensors, the resonant sensor system disclosed herein is highly sensitive as opposed to other method of resonance frequency detection. The functionality to step the frequency of the query signal allows for fast interrogation and an extended linearity (e.g., high linearity) of the resonant sensors. The examples disclosed herein are not limited by the upper threshold and lower threshold group delays corresponding to a resonant sensor because the measurement frequency can be adjusted to extend the range of linearity of the resonant sensors. The disclosed methods, apparatus and articles of manufacture improve the efficiency of using a computing device by reducing the amount of time needed to make a high-resolution measurement of a resonant sensor without increasing power consumption or increasing components used to monitor the resonant sensor. The disclosed methods, apparatus and articles of manufacture are accordingly directed to one or more improvement(s) in the functioning of a computer.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An apparatus comprising:
a modulation manager configured to query a resonant sensor with a modulated signal including a frequency; and
a resonance determiner configured to determine a resonance frequency of the resonant sensor based on a group delay generated by the resonant sensor and the frequency;
wherein a group delay is a time required for an envelope of a signal with variable amplitude to pass through a network;
further including a signal analyzer configured to:
determine the group delay;
determine a polarity associated with the group delay; and
determine whether the group delay is between an upper threshold and a lower threshold; and
the modulation manager configured to, in response to the signal analyzer determining that the group delay is not between the upper threshold and the lower threshold, adjust the frequency of the modulated signal.

2. The apparatus of claim 1, wherein the frequency is a first frequency and the modulated signal is amplitude modulated based on a modulating signal including a second frequency.

3. The apparatus of claim 1, wherein the modulation manager is configured to:
when the group delay is above the upper threshold, adjust the frequency by an inverse of the polarity; and
when the group delay is below the lower threshold, adjust the frequency by the polarity.

4. The apparatus of claim 1, wherein the modulated signal is a first modulated signal, the frequency is a first frequency, the group delay is a first group delay, and the modulation manager is configured to:
determine whether a first interrogation method or a second interrogation method is used to query the resonant sensor; and
in response to the second interrogation method being used to query the resonant sensor, query the resonant sensor with a second modulated signal including a second frequency, the second frequency different than the first frequency; and
the signal analyzer configured to determine a second group delay associated with the resonant sensor.

5. The apparatus of claim 4, wherein the first interrogation method includes a wired interrogation method and the second interrogation method includes a wireless interrogation method.

6. The apparatus of claim 4, wherein the resonance determiner is configured to:
in response to the first interrogation method not being used to query the resonant sensor, determine a difference between the first group delay and the second group delay; and
compute the resonance frequency and a quality factor of the resonant sensor based on the first group delay and the second group delay.

7. A system to comprising:
an oscillator coupled to a resonant sensor, the oscillator configured to generate a first signal at a frequency;
a controller coupled to the oscillator, the controller configured to:
set the frequency of the oscillator; and
query the resonant sensor with a second signal including the frequency;
a time-to-digital converter (TDC) coupled to the controller and the resonant sensor, the TDC to determine a group delay generated by the resonant sensor wherein a group delay is a time required for an envelope of a signal with variable amplitude to pass through a network; and
the controller to determine a resonance frequency of the resonant sensor based on the group delay and the frequency.

8. The system of claim 7, wherein the TDC is configured to:
determine a polarity associated with the group delay; and
transmit a third signal including the group delay and the polarity to the controller; and
the controller configured to:
determine the group delay and the polarity based on the third signal;
determine whether the group delay is between an upper threshold and a lower threshold; and in response to determining that the group delay is not between the upper threshold and the lower threshold, adjust the frequency of the first signal.

9. The system of claim 8, wherein the oscillator is a first oscillator, the frequency is a first frequency, and the system further including a second oscillator coupled to the controller and the TDC, the second oscillator configured to generate a fourth signal at a second frequency, the second signal including the second frequency.

10. The system of claim 8, wherein the controller is configured to:
   when the group delay is above the upper threshold, adjust the frequency by an inverse of the polarity; and
   when the group delay is below the lower threshold, adjust the frequency by the polarity.

11. The system of claim 8, wherein the frequency is a first frequency, the group delay is a first group delay, and the controller is to:
   determine whether a first interrogation method or a second interrogation method is used to query the resonant sensor;
   in response to the first interrogation method not being used to query the resonant sensor, query the resonant sensor with a fourth signal including a second frequency, the second frequency different than the first frequency; and
   determine a second group delay associated with the resonant sensor.

12. The system of claim 11, wherein the first interrogation method includes a wired interrogation method and the second interrogation method includes a wireless interrogation method.

13. The system of claim 11, wherein the controller is configured to:
   in response to the first interrogation method not being used to query the resonant sensor, determine a difference between the first group delay and the second group delay; and
   compute the resonance frequency and a quality factor of the resonant sensor based on the first group delay and the second group delay.

14. A non-transitory computer readable medium comprising instructions that, when executed, cause a machine to:
   query a resonant sensor with a modulated signal including a frequency; and
   determine a resonance frequency of the resonant sensor based on a group delay generated by the resonant sensor and the frequency;
   wherein a group delay is a time required for an envelope of a signal with variable amplitude to pass through a network;
   wherein the instructions, when executed, cause the machine to:
   determine the group delay;
   determine a polarity associated with the group delay;
   determine whether the group delay is between an upper threshold and a lower threshold; and
   in response to determining that the group delay is not between the upper threshold and the lower threshold, adjust the frequency of the modulated signal.

15. The computer readable medium of claim 14, wherein the frequency is a first frequency and the modulated signal is amplitude modulated based on a modulating signal including a second frequency.

16. The computer readable medium of claim 14, wherein the instructions, when executed, cause the machine to:
   when the group delay is above the upper threshold, adjust the frequency by an inverse of the polarity; and
   when the group delay is below the lower threshold, adjust the frequency by the polarity.

17. The computer readable medium of claim 14, wherein the modulated signal is a first modulated signal, the frequency is a first frequency, the group delay is a first group delay, and the instructions, when executed, cause the machine to:
   determine whether a first interrogation method or a second interrogation method is used to query the resonant sensor; and
   in response to the second interrogation method being used to query the resonant sensor:
      query the resonant sensor with a second modulated signal including a second frequency, the second frequency different than the first frequency;
      determine a second group delay associated with the resonant sensor; and
      determine a difference between the first group delay and the second group delay; and
   compute the resonance frequency and a quality factor of the resonant sensor based on the first group delay and the second group delay.

18. The computer readable medium of claim 17, wherein the first interrogation method includes a wired interrogation method and the second interrogation method includes a wireless interrogation method.

\* \* \* \* \*